United States Patent
Yokozeki et al.

(10) Patent No.: US 6,930,344 B2
(45) Date of Patent: Aug. 16, 2005

(54) NONVOLATILE SEMICONDUCTOR MEMORY DEVICE WITH STABLE FERROELECTRIC CAPACITOR

(75) Inventors: Wataru Yokozeki, Kunitachi (JP); Akio Itoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/736,788

(22) Filed: Dec. 17, 2003

(65) Prior Publication Data

US 2004/0173830 A1 Sep. 9, 2004

(30) Foreign Application Priority Data

Dec. 20, 2002 (JP) ........................................ 2002-371135

(51) Int. Cl.⁷ ........................ H01L 27/108; H01L 29/76; H01L 29/94; H01L 31/119
(52) U.S. Cl. .......................... 257/296; 257/903; 257/904
(58) Field of Search ................................ 257/296, 903, 257/904

(56) References Cited

U.S. PATENT DOCUMENTS

| | | | | |
|---|---|---|---|---|
| 5,051,951 A | * | 9/1991 | Maly et al. | 365/185.07 |
| 5,406,107 A | * | 4/1995 | Yamaguchi | 257/393 |
| 5,757,031 A | * | 5/1998 | Natsume | 257/67 |
| 6,130,470 A | * | 10/2000 | Selcuk | 257/534 |
| 2004/0166596 A1 | * | 8/2004 | Sashida et al. | 438/3 |

OTHER PUBLICATIONS

Tohru Miwa et al.; IEEE 2000 Custom Integrated Circuits Conference, pp. 65–68, May 2000.

* cited by examiner

Primary Examiner—Ngân V. Ngô
(74) Attorney, Agent, or Firm—Westerman, Hattori, Daniels & Adrian, LLP

(57) ABSTRACT

A nonvolatile semiconductor memory device includes a substrate, a plurality of transistors formed on the substrate to constitute a latch, a plate line, and a pair of capacitors each including a lower electrode, a ferroelectric film, and an upper electrode, the pair of capacitors being provided in a layer situated above the substrate and below a metal wiring layer in which the plate line is formed.

20 Claims, 24 Drawing Sheets

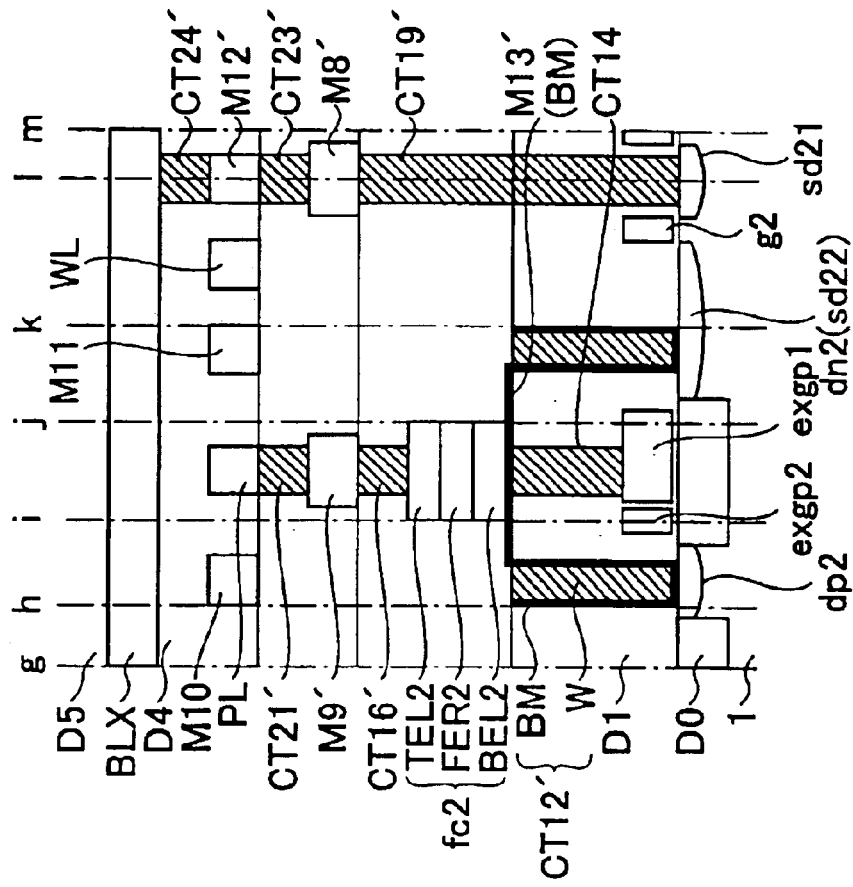
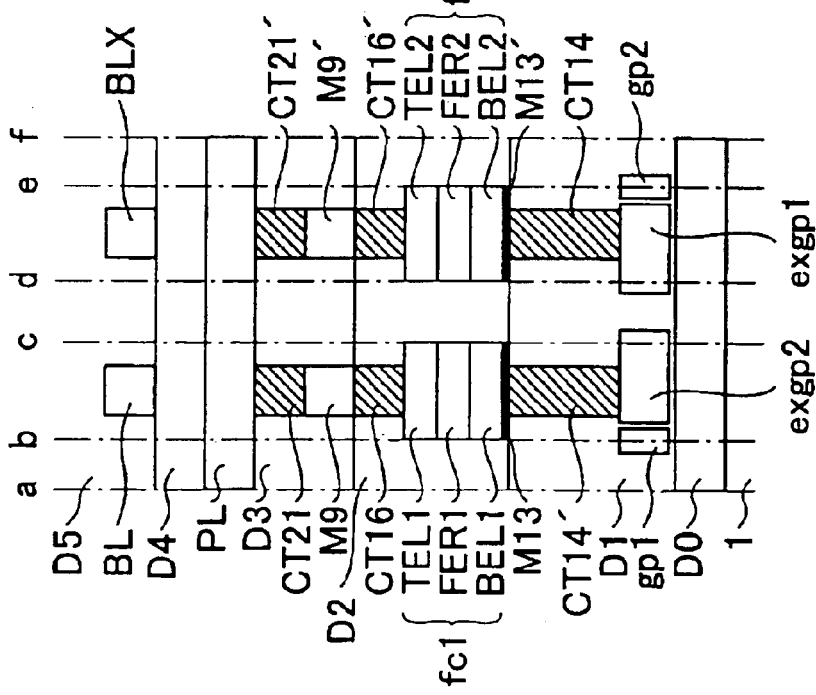

NONVOLATILE SEMICONDUCTOR MEMORY DEVICE WITH STABLE FERROELECTRIC CAPACITOR

BACKGROUND OF THE INVENTION

1. Field of the Invention

The present invention generally relates to nonvolatile semiconductor memory devices, and particularly relates to the stacked-layer structure of a nonvolatile SRAM cell where a ferroelectric capacitor is provided as a backup for stored data. The present invention also relates to a method of making such stacked-layer structure.

2. Description of the Related Art

Conventional latch circuits are comprised of volatile circuits. When power is turned off, stored data is lost. In recent years, schemes have been proposed for nonvolatile SRAMs (static random access memory) (e.g., Non-patent Document 1 and Non-patent Document 2). In nonvolatile SRAMs, a ferroelectric film (PZT: Pb(Zr, Ti)O3, SBT: SrBi2Ta2O9) is attached as a varying capacitance to a latch circuit that is used as a memory cell.

In such nonvolatile SRAMs, stored data is changed into nonvolatile data as a residual polarization of the ferroelectric capacitor prior to power-off. Such data is retrieved as complementary data of the memory-cell latch circuit upon the power-on. A ferroelectric capacitor in the conventional stacked-layer structure of a nonvolatile SRAM is formed above the layers in which metal wiring such as bit lines are provided. Such order of stacked layers achieves area size that is compatible to that of SRAM cells.

[Non-patent Document 1] Proceeding of IEEE2000 Custom Integrated Circuits Conference, pp. 65–68, May, 2000.

[Non-patenting Document 2] TECHNICAL REPORT OF IEICE. SDM 2001-128, ICD2001-51, May, 2000.

At present, spin coating or sputtering is known as a method that achieves the stable growth of a ferroelectric film such as PZT. 600 degrees Celsius is known to be a preferable temperature for stable growth. Because of this, the process of growing a ferroelectric film is preferably performed before the process of forming metal wiring made of aluminum (AL) or copper (Cu), which have a melting point lower than the growth temperature of a ferroelectric film.

A latch circuit is comprised of two inverters that are cross-coupled. The connections between the two inverters are provided by metal wiring resources such that a gate node of one inverter is coupled to a drain node of the other inverter. Straight above the two inverters, cross-connects are formed between metal wiring and contacts such as gate nodes and drain nodes. This structure makes it difficult to form a ferroelectric capacitor between the layer in which an inverter circuit is formed and the layer in which metal wiring is formed.

Conventional nonvolatile SRAMs cope with structural limitations as described above by growing the ferroelectric film at low temperature (450 degrees Celsius) by the MOCVD (metal-organic CVD) method after the process of forming metal wiring. In general, the quality of a film grown at low temperature is not as high as that of a film grown at high temperature (about 650 degrees Celsius). This causes an increase in the leak current between electrodes and the degradation of polarization characteristics of ferroelectric hysteresis, giving rise to new problems that need to be attended to.

Accordingly, there is a need for a stacked-layer structure of a nonvolatile semiconductor memory device for which a stable ferroelectric film can be formed while taking into account the cross-coupling connection of a latch circuit. There is also a need for a method of forming such a stacked-layer structure.

Moreover, there is a need for a stacked-layer structure of a nonvolatile semiconductor memory device for which a stable ferroelectric film can be formed while taking into account the cross-coupling connection of a latch circuit, and by which the size of the nonvolatile SRAM cell is reduced. There is also a need for a method of forming such a stacked-layer structure.

SUMMARY OF THE INVENTION

It is a general object of the present invention to provide a nonvolatile semiconductor memory device that substantially obviates one or more problems caused by the limitations and disadvantages of the related art.

It is another and more specific object of the present invention to provide a nonvolatile semiconductor memory device for which a stable ferroelectric film can be formed while taking into account the cross-coupling connection of a latch circuit.

It is yet another and more specific object of the present invention to provide a nonvolatile semiconductor memory device for which a stable ferroelectric film can be formed while taking into account the cross-coupling connection of a latch circuit, and which can reduce the size of a nonvolatile SRAM cell.

In order to achieve the objects of the invention, a nonvolatile semiconductor memory device includes a substrate, a plurality of transistors formed on the substrate to constitute a latch, a plate line, and a pair of capacitors each including a lower electrode, a ferroelectric film, and an upper electrode, the pair of capacitors being provided in a layer situated above the substrate and below a metal wiring layer in which the plate line is formed.

According to another aspect of the invention, a nonvolatile semiconductor memory device includes a substrate, two inverters formed on the substrate and cross-coupled, each inverter including a drain diffusion region, a plate line, and a pair of capacitors each including a lower electrode coupled to the drain diffusion region of a corresponding one of the two inverters, a ferroelectric film, and an upper electrode coupled to the plate line, the pair of capacitors being provided in a layer situated above the substrate and below a metal wiring layer in which the plate line is formed.

According to another aspect of the invention, a nonvolatile semiconductor memory device includes a substrate, a plurality of transistors formed on the substrate to constitute a latch, each of the transistors including a first impurity diffusion region for coupling to a power supply voltage and a second impurity diffusion region having an extending region, a plate line, and a pair of capacitors provided in a layer situated above the substrate and below a metal wiring layer in which the plate line is formed, each of the capacitors including a lower electrode, a ferroelectric film, and an upper electrode coupled to the plate line, wherein the lower electrode is coupled to the extending region.

According to another aspect of the invention, a nonvolatile semiconductor memory device includes a substrate, a plurality of transistors formed on the substrate to constitute a latch, each of the transistors including a first impurity diffusion region for coupling to a power supply voltage and a second impurity diffusion region different from the first impurity diffusion region, local wiring connecting between the second impurity diffusion region of one of the transistors to the second impurity diffusion region of another one of the transistors, a plate line, and a pair of capacitors provided in a layer situated above the substrate and below a metal wiring layer in which the plate line is formed, each of the capacitors including a lower electrode, a ferroelectric film, and an upper electrode coupled to the plate line, wherein the lower electrode is coupled to the local wiring, and the local wiring is made of a material having a higher melting point than a metal that forms the plate line.

According to another aspect of the invention, a method of forming a nonvolatile semiconductor memory device includes the steps of forming a plurality of transistors in a substrate for making a latch circuit, forming a pair of capacitors in layers situated above the substrate, each of which includes a lower electrode, a ferroelectric film, and an upper electrode, and forming metal wiring inclusive of a plate line in a layer above the layers in which the pair of capacitors is formed.

According to another aspect of the invention, a semiconductor circuit includes a substrate, a first inverter provided on the substrate and includes a first gate electrode, and a second inverter provided on the substrate at a position symmetrical to the first inverter and includes a second gate electrode, wherein the first gate electrode has a region extending toward the second gate electrode, the extending region including a portion at which a plug is formed to provide an electrical coupling between the first gate electrode and two drain diffusion regions that are coupled to the second gate electrode, the electrical coupling being provided in a layer situated above the substrate.

The nonvolatile semiconductor memory device according to the invention as described above is mainly directed to two different types of stacked-layer structures. In the first type, the lower electrode of a ferroelectric capacitor is coupled to an extending region, which extends from one of the two drain diffusion regions that are included in each of the two inverters forming a latch circuit. This corresponds to a first embodiment, which will be later described.

In the second type, the lower electrode of a ferroelectric capacitor is coupled to local wiring that connects drain diffusion regions in each of the two inverters. This corresponds to a second through sixth embodiments, which will be later described and present various constructions and materials for formation of the local wiring.

The stacked-layer structure of the first type is mainly aimed at achieving the stable growth of a ferroelectric film, and the stacked-layer structure of the second type is mainly aimed at size reduction of a nonvolatile SRAM cell in addition to the stable growth of a ferroelectric film. The present invention also provides the cross-coupling connections of a latch circuit that are specifically designed for the first and second types of stacked-layer structures, respectively.

Other objects and further features of the present invention will be apparent from the following detailed description when read in conjunction with the accompanying drawings.

BRIEF DESCRIPTION OF THE DRAWINGS

FIGS. 23A and 2.3B are illustrative drawings showing cross-sectional views of a nonvolatile SRAM cell according to a fifth embodiment.

DESCRIPTION OF THE PREFERRED EMBODIMENTS

In the following, embodiments of the present invention will be described with reference to the accompanying drawings.

Figure 1:
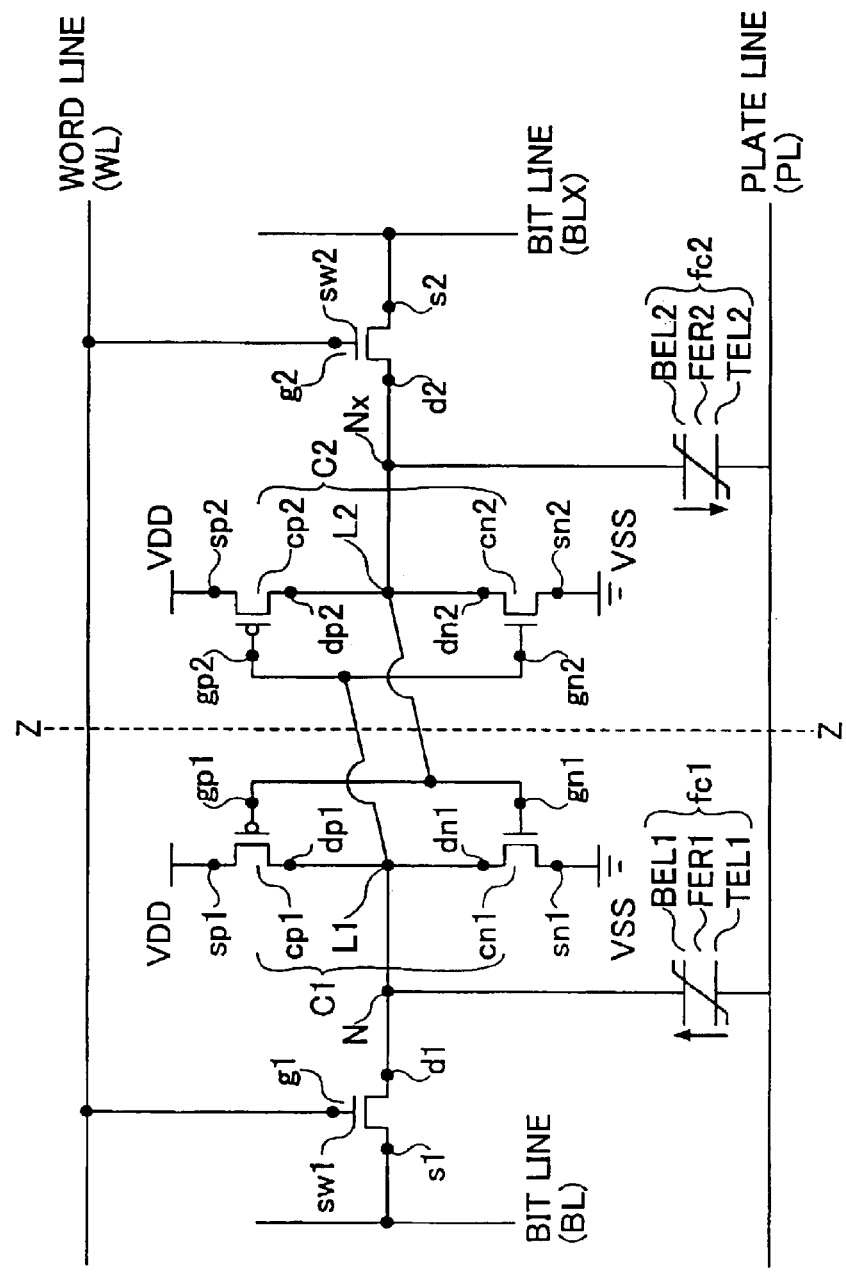
FIG. 1 is a circuit diagram showing an example of the construction of a nonvolatile SRAM cell according to the invention.

FIG. 1 is a circuit diagram showing an example of the construction of a nonvolatile SRAM cell according to the invention. The nonvolatile SRAM cell includes a pair of CMOS inverters c1 and c2, two n-type MOS transistors sw1 and sw2 for signal transfer, and two ferroelectric capacitors fc1 and fc2.

The nonvolatile SRAM cell shown in FIG. 1 has a symmetric circuit structure on the left-hand side and the right-hand side with respect to a center line Z–Z'. In the following, this symmetry is utilized when describing the circuit construction. It should be noted that this symmetrical circuit construction relates to device arrangement in the design layout, which will be described with reference to FIG. 2 and subsequent drawings.

The CMOS inverters c1 and c2 are cross-coupled to each other so as to form a latch circuit. Specifically, a gate gp1 (gp2) (shown as a point for the sake of illustration) of the CMOS inverter c1 (c2) is connected to drains dp2 (dp1) and dn2 (dn1) of the CMOS inverter c2 (c1).

The CMOS inverter c1 (c2) includes a p-type MOS transistor cp1 (cp2) and an n-type MOS transistor cn1 (cn2). A sauce sp1 (sp2) of the p-type MOS transistor cp1 (cp2) is connected to a power supply voltage VDD, and a sauce sn1 (sn2) of the n-type MOS transistor cn1 (cn2) is connected to a ground voltage VSS.

The n-type MOS transistor sw1 (sw2) connects a complementary node N (NX) of the latch circuit to a bit line BL (BLX) for data writing and data reading. Gates g1 and g2 of the n-type MOS transistors sw1 and sw2 are connected to a word line WL.

A sauce (or drain) s1 (s2) of the n-type MOS transistor sw1 (sw2) is connected to the bit line BL (BLX). A drain (or sauce) d1 (d2) is coupled through the storage node N (NX) to a lower electrode BEL1 (BEL2) of the ferroelectric capacitor fc1 (fc2), the drains dp1 and dn1 (dp2 and dn2) of the CMOS inverter c1 (c2), and the gates gp2 and gn2 (gp1 and gn1) of the CMOS inverter c2 (c1).

The ferroelectric capacitor fc1 (fc2) is comprised of the lower electrode BEL1 (BEL2), a ferroelectric film FER1 (FER2), and an upper electrode TEL1 (TEL2). The upper electrodes TEL1 and TEL2 are connected to a plate line PL.

In FIG. 1, for the sake of convenience, the storage node N (NX) is shown as a point from which three branches extend toward the drain (or sauce) d1 (d2) of the n-type MOS transistor sw1 (sw2), the lower electrode BEL1 (BEL2) of the ferroelectric capacitor fc1 (fc2), and the drains dp1 and dn1 (dp2 and dn2) of the CMOS inverter c1 (c2).

In the invention, the storage node N (NX) corresponds to a point at which the lower electrode BEL1 (BEL2) of the ferroelectric capacitor fc1 (fc2) is connected to each of the two inverters constituting the latch circuit, or corresponds to wiring inclusive of such a point.

FIG. 2 through FIG. 7 show the layout of the nonvolatile SRAM cell according to the first embodiment of the invention. Steps by which device elements are stacked one over another are shown in FIG. 2 through FIG. 7. The layout illustrated in FIG. 2 through FIG. 7 will be described with reference to the circuit connections shown in FIG. 1.

Figure 2:
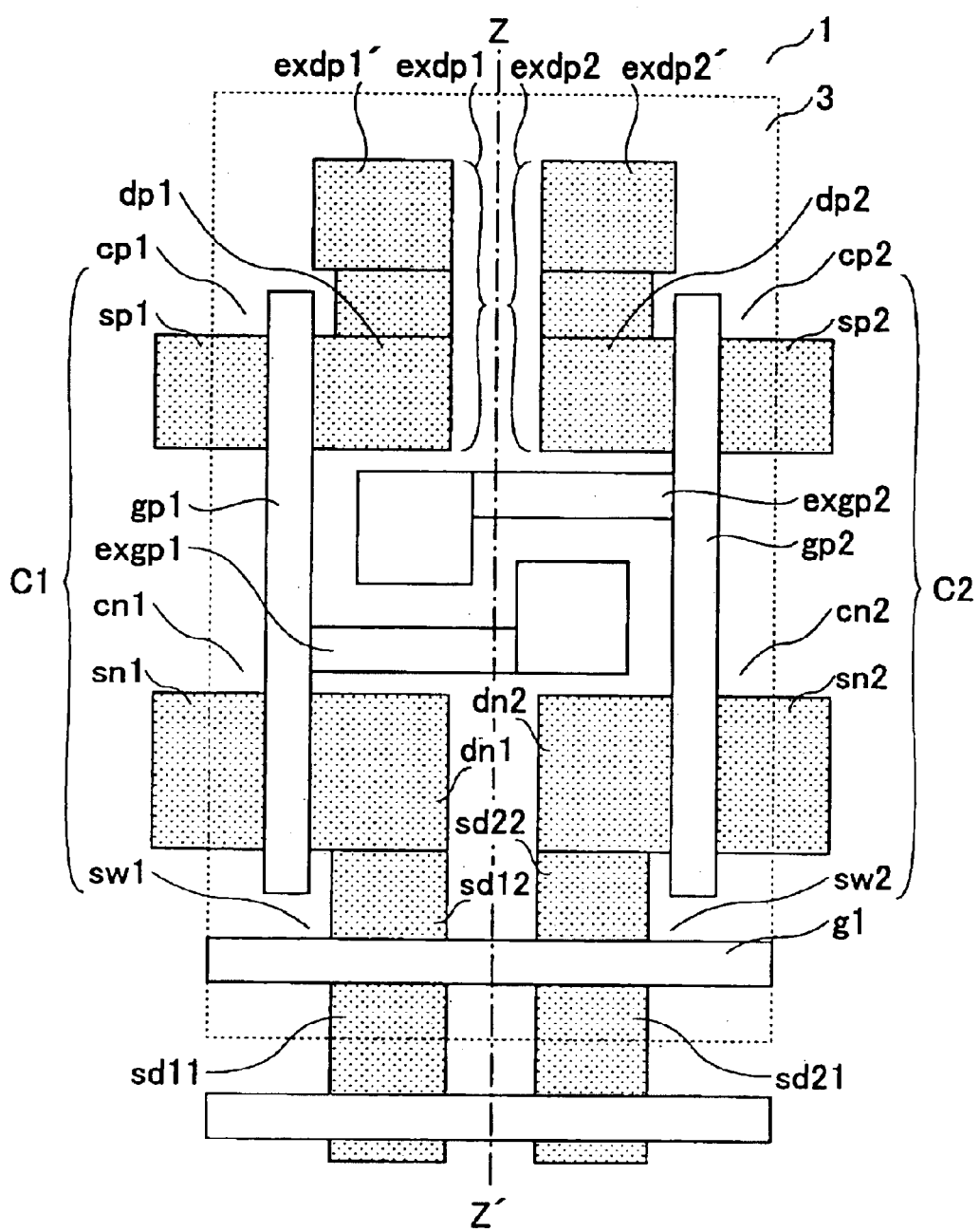
FIG. 2 is an illustrative drawing showing the first layout of a nonvolatile SRAM cell according to a first embodiment of the invention.

As a premise, a plurality of nonvolatile SRAM cells 3 according to this embodiment are organized in a matrix form and formed on a silicon substrate 1. FIG. 2 illustrates the layout of one of the nonvolatile SRAM cells 3.

In the cell layout shown in FIG. 2, the p-type MOS transistor cp1 and the n-type MOS transistor cn1 of the CMOS inverter c1 are formed. In the p-type MOS transistor cp2, the drain diffusion region dp1 and the sauce diffusion region sp1 are formed to extend in the direction perpendicular to the cell center line Z–Z'. The drain diffusion region dp1, the gate electrode gp1, and the sauce diffusion region sp1 are formed in the order named from the center line Z–Z'.

In the n-type MOS transistor cn1, the drain region dn1 and the sauce diffusion region sn1 are formed to extend in the direction perpendicular to the center line Z–Z'. The drain diffusion region dn1, the gate electrode gp1, and the sauce diffusion region sn1 are formed in the order named from the center line Z–Z'. The gate electrode gp1 is common to the p-type MOS transistor cp1 and the n-type MOS transistor cn1, and is formed to extend in the direction parallel to the center line Z–Z'.

Similarly, the p-type MOS transistor cp2 and the n-type MOS transistor cn2 of the CMOS inverter c2 are formed. In the p-type MOS transistor cp2, the drain diffusion region dp2 and the sauce diffusion region sp2 are formed to extend in the direction perpendicular to the cell center line Z–Z'. The drain diffusion region dp2, the gate electrode gp2, and the sauce diffusion region sp2 are formed in the order named from the center line Z–Z'.

In the n-type MOS transistor cn2, the drain region dn2 and the sauce diffusion region sn2 are formed to extend in the direction perpendicular to the center line Z–Z'. The drain diffusion region dn2, the gate electrode gp2, and the sauce diffusion region sn2 are formed in the order named from the center line Z–Z'. The gate electrode gp2 is common to the p-type MOS transistor cp2 and the n-type MOS transistor cn2, and is formed to extend in the direction parallel to the center line Z–Z'.

Further, the n-type MOS transistors sw1 and sw2 are formed. The sauce or drain diffusion regions sd11 and sd12 of the n-type MOS transistor sw1 are formed to extend in a direction parallel to the center line Z–Z'. The sauce or drain diffusion region sd12 is connected to the drain diffusion region dn1 of the n-type MOS transistor cn1.

The direction in which the sauce or drain diffusion regions sd12 and sd11 of the n-type MOS transistor sw1 are formed runs perpendicularly to the direction in which the drain region dn1 and the sauce diffusion region sn1 of the n-type MOS transistor cn1 are formed. The gate electrode g1 is common to the n-type MOS transistor sw1 and the n-type MOS transistor sw2, which are symmetrically arranged with respect to the center line Z–Z', and is formed to extend in a direction perpendicular to the center line Z–Z'.

By the same token, the sauce or drain regions sd22 and sd21 of the n-type MOS transistor sw2 are formed to extend in a direction parallel to the center line Z–Z'. The sauce or drain diffusion region sd22 is connected to the drain diffusion region dn2 of the n-type MOS transistor cn2.

The direction in which the sauce or drain regions sd22 and sd21 of the n-type MOS transistor sw2 are formed runs perpendicularly to the direction in which the drain region dn2 and the sauce diffusion region sn2 of the n-type MOS transistor cn2 are formed. As previously described, the gate electrode g1 is shared by the n-type MOS transistors sw1 and sw2. In this embodiment, the gate electrode g1 also serves as a word line WL (see FIG. 1) in order to drive a plurality of neighboring nonvolatile SRAM cells at a time (on a per-bit basis).

In this embodiment, the drain diffusion region dp1 of the p-type MOS transistor cp1 has a region exdp1 that extends (as part of the drain diffusion region dp1) from the drain diffusion region dp1. The region exdp1 is connected across a layer boundary to the ferroelectric capacitor fc1 (see FIG. 3), which will be formed at the next following process.

By the same token, the drain diffusion region dp2 of the p-type MOS transistor cp2 has a region exdp2 that extends (as part of the drain diffusion region dp2) from the drain diffusion region dp2. The region exdp2 is connected across a layer boundary to the ferroelectric capacitor fc2, which will be formed at the next following process.

In order to make a connection across a layer boundary easier, the region exdp1 is formed to extend in a direction substantially perpendicular to the direction in which the drain diffusion region dp1 and the sauce diffusion region sp1 are formed. This region exdp1 extends until it reaches a region exdp1 that is directly below the ferroelectric capacitor fc1.

By the same token, the region exdp2 is formed to extend in a direction substantially perpendicular to the direction in which the drain diffusion region dp2 and the sauce diffusion region sp2 are formed. This region exdp2 extends until it reaches a region exdp2' that is directly below the ferroelectric capacitor fc2.

In this embodiment, moreover, the gate electrode gp1 has a region exgp1 that extends (as part of gate electrode gp1) from the gate electrode gp1. The region exgp1 is connected across a layer boundary to wiring M1' (see FIG. 5) that connects between the drain diffusion region dp2 and the drain diffusion region dn2 of the CMOS inverter c2.

In order to make a connection across a layer boundary easier, the region exgp1 extends toward the opposite gate electrode gp2 in a direction substantially perpendicular to the direction in which the gate electrode gp1 is formed.

As will be described later, the region exgp1 extends until it reaches a point that is substantially straight below the wiring M1' that connects the drain diffusion region dp2 and the drain diffusion region dn2 of the CMOS inverter c2.

Similarly, the gate electrode gp2 has a region exgp2 that extends (as part of gate electrode gp2) from the gate electrode gp2. The region exgp2 is connected across a layer boundary to wiring M1 that connects between the drain diffusion region dp1 and the drain diffusion region dn1 of the CMOS inverter c1.

In order to make a connection across a layer boundary easier, the region exgp2 extends toward the opposite gate electrode gp1 in a direction substantially perpendicular to the direction in which the gate electrode gp2 is formed.

As will be described later, the region exgp2 extends until it reaches a point that is substantially straight below the wiring M1 that connects the drain diffusion region dp1 and the drain diffusion region dn1 of the CMOS inverter c1.

Figure 3:
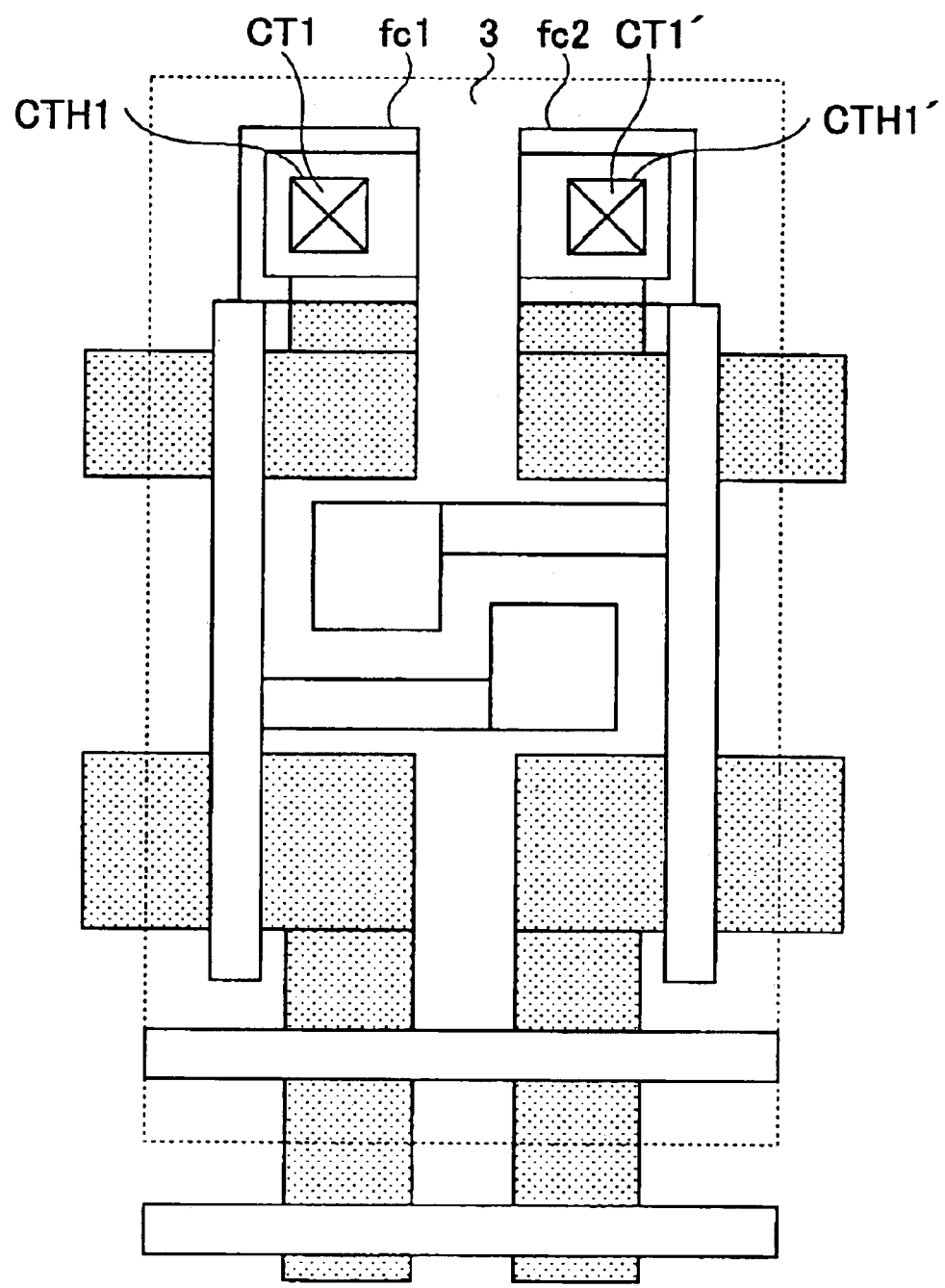
FIG. 3 is an illustrative drawing showing the second layout of the nonvolatile SRAM cell according to the first embodiment of the invention.

In the layout shown in FIG. 3, contact plugs CT1 and CT1' are formed. These contact plugs are formed to correspond to the respective regions exdp' and exdp2', which are part of the regions exdp1 and exdp2 shown in FIG. 2, and are directly below the ferroelectric capacitors fc1 and fc2 that will subsequently be formed.

The ferroelectric capacitor fc1 is formed on the contact plug CT1. The ferroelectric capacitor fc1 is comprised of the lower electrode BEL1, the ferroelectric film FER1, and the upper electrode TEL1 (not shown). By the same token, the ferroelectric capacitor fc2 is formed on the contact plug CT1'. The ferroelectric capacitor fc2 is comprised of the lower electrode BEL2, the ferroelectric film FER2, and the upper electrode TEL2 (see FIG. 8A).

Figure 4:
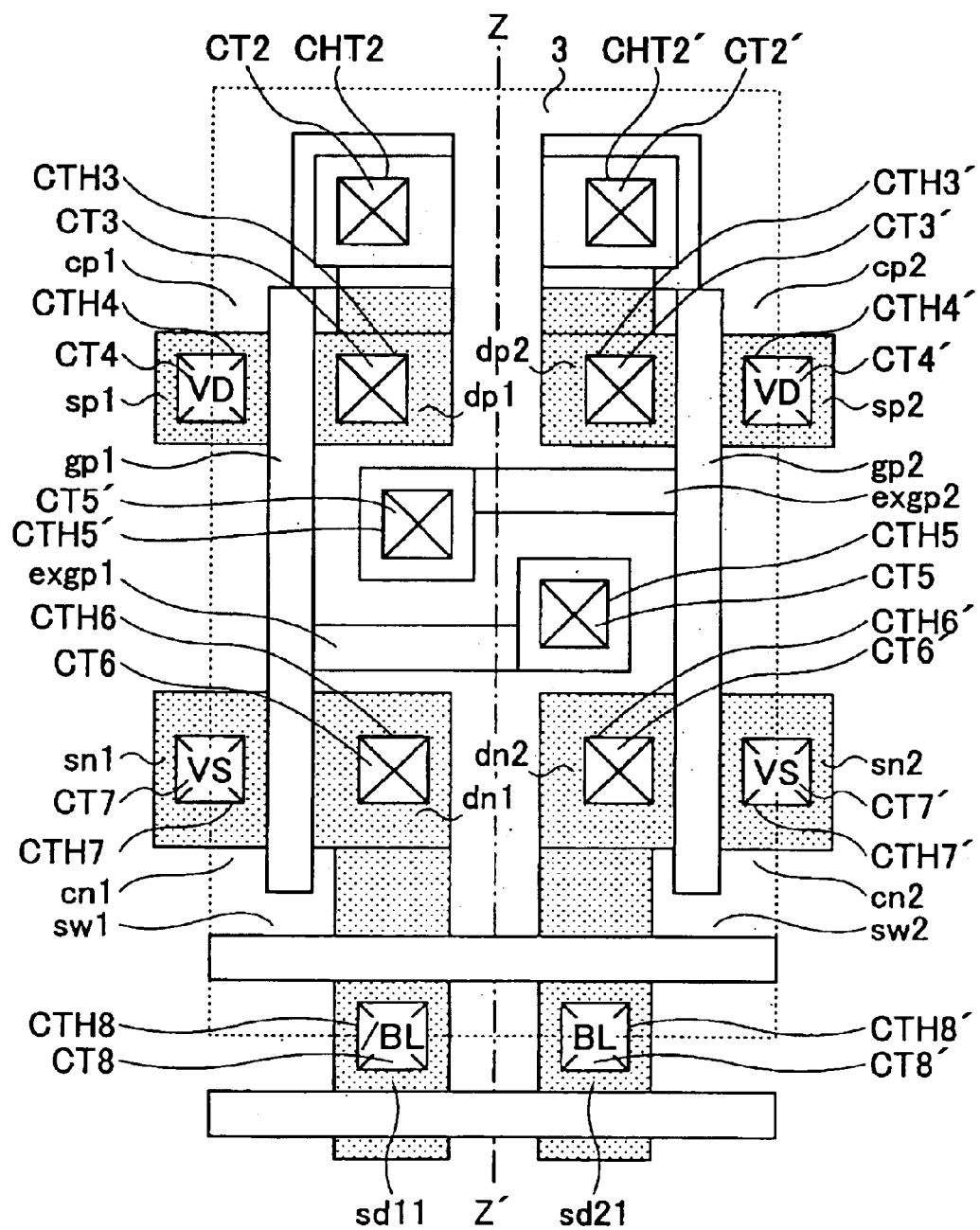
FIG. 4 is an illustrative drawing showing the third layout of the nonvolatile SRAM cell according to the first embodiment of the invention.

In the layout shown in FIG. 4, via plugs CT2 and CT2' and contact plugs CT3–CT8 and CT3'–CT8' are formed. The via plug CT2 is formed on the upper electrode TEL1 of the ferroelectric capacitor fc1. The via plug CT2 is situated straight above the contact plug CT1 through the intervening ferroelectric capacitor fc1.

Similarly, the via plug CT2' is formed on the upper electrode TEL2 of the ferroelectric capacitor fc2. The via plug CT2' is situated straight above the contact plug CT1' through the intervening ferroelectric capacitor fc2 (see FIG. 8A).

The contact plugs CT3–CT8 and CT3'–CT8' are connected to electrodes or diffusion regions of MOS transistors formed on the silicon substrate 1. In detail, the contact plug CT3 is formed to correspond to the drain diffusion region dp1 of the p-type MOS transistor cp1. The contact plug CT4 is formed to correspond to the sauce diffusion region sp1.

Similarly, the contact plug CT3' is formed to correspond to the drain diffusion region dp2 of the p-type MOS transistor cp2. The contact plug CT4' is formed to correspond to the sauce diffusion region sp2.

The contact plug CT6 is formed, corresponding to the drain diffusion region dn1 of the n-type MOS transistor cn1. The contact plug CT7 is formed, corresponding to the sauce diffusion region sn1. Similarly, the contact plug CT6' is formed, corresponding to the drain diffusion region dn2 of the n-type MOS transistor cn2. The contact plug CT7' is formed, corresponding to the sauce diffusion region sn2.

Furthermore, the contact plug CT5 is formed, corresponding to the region exgp1 extending from the gate electrode gp1. Similarly, the contact plug CT5' is formed, corresponding to the region exgp2 extending from the gate electrode gp2. Moreover, the contact plug CT8 is formed, corresponding to the sauce or drain diffusion region sd11 of the n-type MOS transistor sw1. Similarly, the contact plug CT8' is formed, corresponding to the sauce or drain diffusion region sd21 of the n-type MOS transistor sw2.

Figure 5:
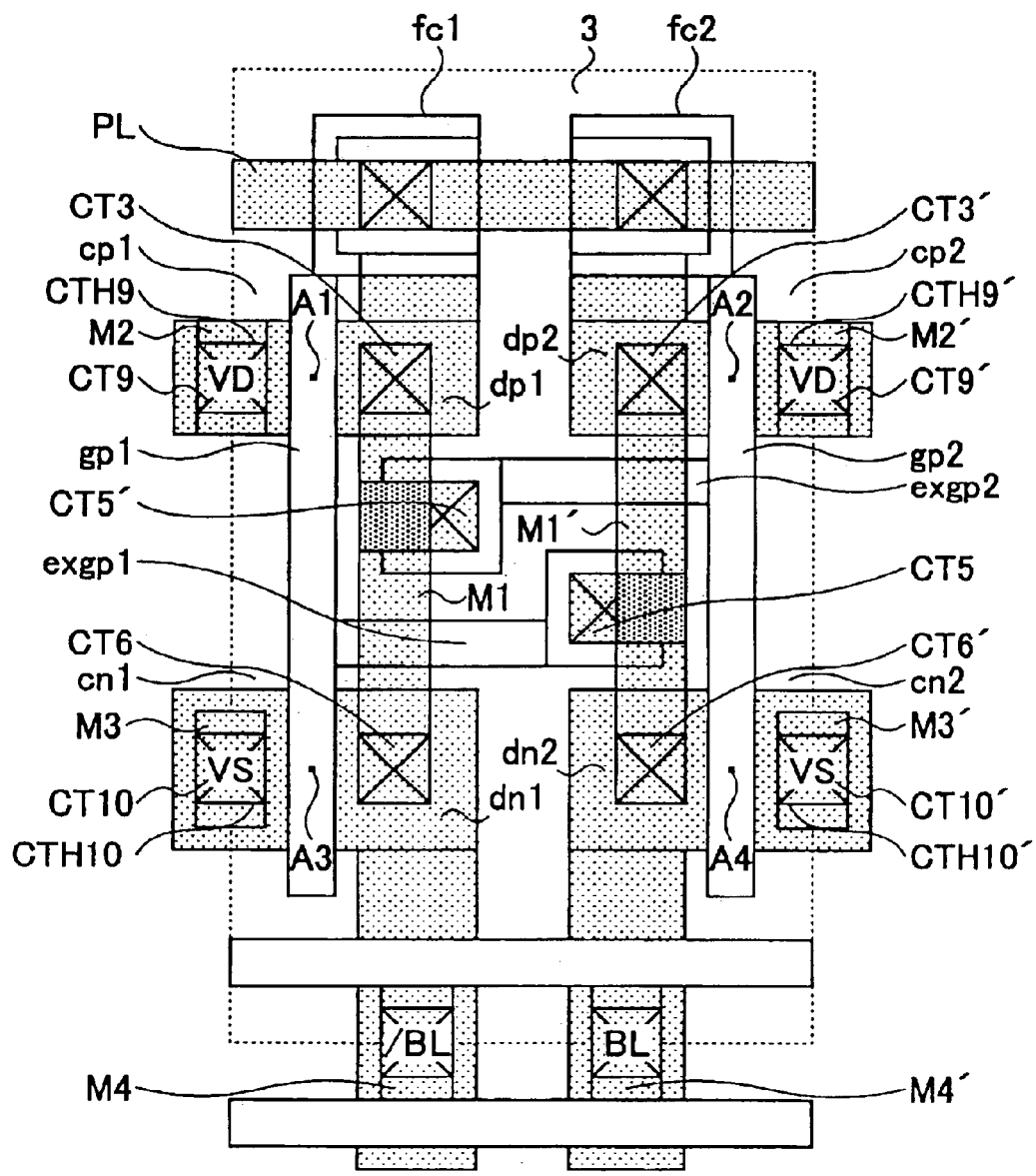
FIG. 5 is an illustrative drawing showing the fourth layout of the nonvolatile SRAM cell according to the first embodiment of the invention.

In the layout shown in FIG. 5, the plate line PL is formed. The plate line is connected to the via plug CT2 and CT2' shown in FIG. 4. With this provision, the upper electrode TEL1 of the ferroelectric capacitor fc1 is coupled to the plate electrode PL through the via plug CT2. By the same token, the upper electrode TEL2 of the ferroelectric capacitor fc2 is coupled to the plate electrode PL through the via plug CT2' (see FIG. 8A).

Moreover, the metal wiring M1 is formed. The metal wiring M1 connects between the contact plug CT3 and the contact plug CT6, and is also connected to the plug CT5'. Similarly, the metal wiring M1' is formed. The metal wiring M1' connects between the contact plug CT3' and the contact plug CT6', and is also connected to the plug CT5.

The metal wiring M1 connects between the drain diffusion region dp1 of the p-type MOS transistor cp1 and the drain diffusion region dn1 of the n-type MOS transistor cn1. The metal wiring M1 also connects the drain diffusion regions dp1 and dn1 to the gate electrode gp2.

In the same manner, the metal wiring M1' connects between the drain diffusion region dp2 of the p-type MOS transistor cp2 and the drain diffusion region dn2 of the n-type MOS transistor cn2. The metal wiring M1' also connects the drain diffusion regions dp2 and dn2 to the gate electrode gp1. The metal wiring M1 and M1' and the regions exgp2 and exgp1 together make up the cross-coupling connection of the latch circuit (see FIG. 1).

Furthermore, plug contacts M2, M2', M3, M3', M4, and M4' are formed that electrically connects between the plugs. The plug contact M2 connects a via plug CT9 that is to be subsequently formed to the contact plug CT4 (see FIG. 4). Similarly, the plug contact M2' connects a via plug CT9' that is to be subsequently formed to the contact plug CT4' (see FIG. 8B).

The plug contact M3 connects a via plug CT10 that is to be subsequently formed to the contact plug CT7. Similarly, the plug contact M3' connects a via plug CT10' that is to be subsequently formed to the contact plug CT7'. The plug contact M4 connects a via plug CT11 that is to be subsequently formed (see FIG. 6) to the contact plug CT8. Similarly, the plug contact M4' connects a via plug CT11' that is to be subsequently formed to the contact plug CT8'.

With reference to FIG. 4 and FIG. 5, the drain diffusion region dp1 of the p-type MOS transistor cp1 and the drain diffusion region dn1 of the n-type MOS transistor cn1 are coupled to each other through the contact plugs CT3 and CT6 in a layer above a layer in which the ferroelectric capacitor fc1 is situated.

By the same token, the drain diffusion region dp2 of the p-type MOS transistor cp2 and the drain diffusion region dn2 of the n-type MOS transistor cn2 are coupled to each other through the contact plugs CT3' and CT6' in a layer above a layer in which the ferroelectric capacitor fc2 is situated.

In this embodiment, the ferroelectric capacitors fc1 and fc2 are situated outside a plane region (e.g., a rectangular region having vertexes A1, A2, A3, and A4) that is defined by the transistors cp2, cn1, cp2, and cn2 constituting a pair of the CMOS inverters c1 and c2. This provision makes it possible to stabilize the film quality of the ferroelectric capacitors fc1 and fc2, and makes it easier to design and manufacture the stacked-layer structure in such a defined region.

Figure 6:
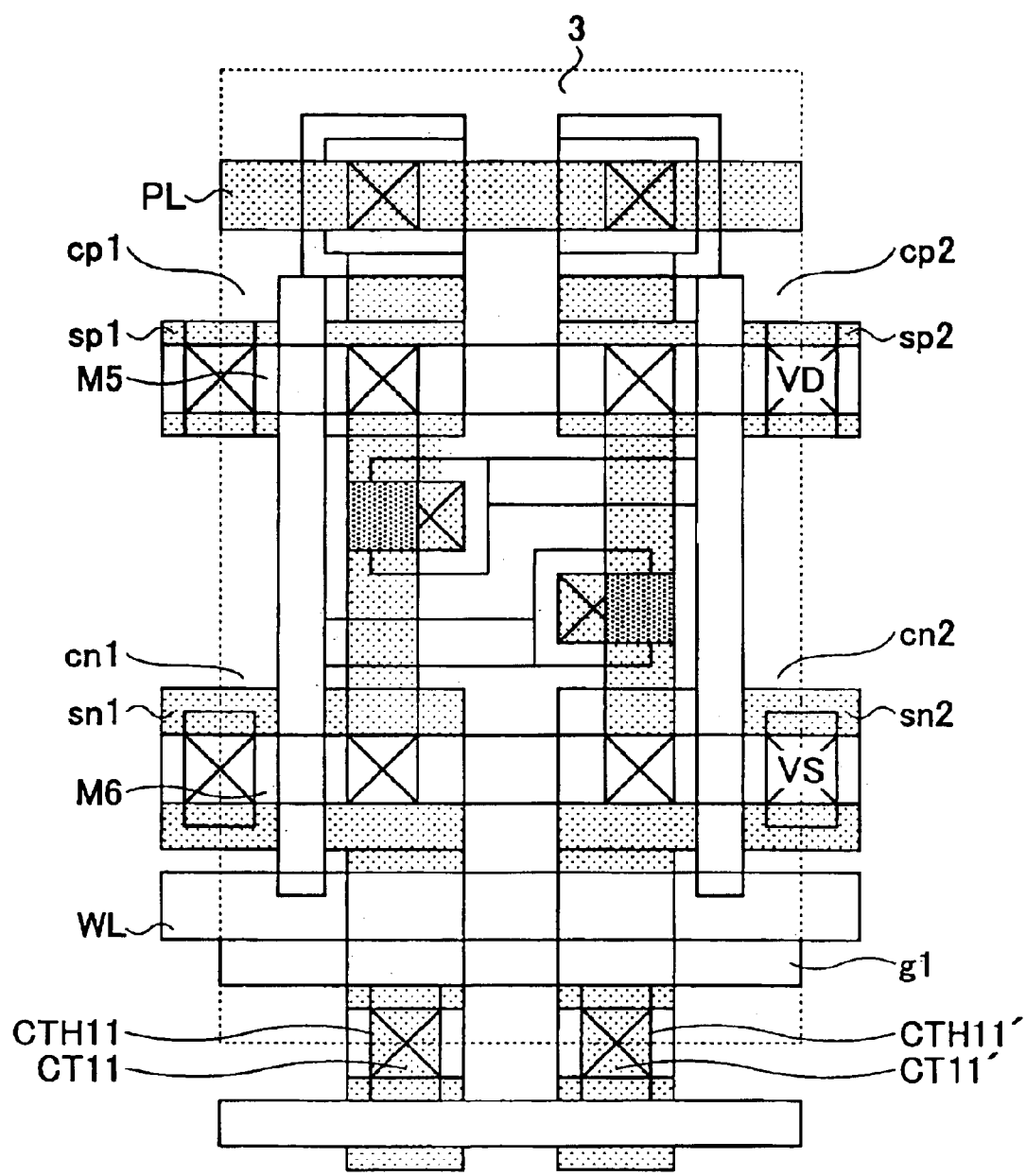
FIG. 6 is an illustrative drawing showing the fifth layout of the nonvolatile SRAM cell according to the first embodiment of the invention.

In the layout shown in FIG. 6, metal wiring M5 coupled to the power supply voltage VDD and metal wiring M6 coupled to the ground voltage VSS are formed. The metal wiring M5 is connected to the via plugs CT9 and CT9' (see FIG. 5). With this provision, the sauce diffusion region sp1 of the p-type MOS transistor cp1 and the sauce diffusion region sp2 of the p-type MOS transistor cp2 are coupled to the power supply voltage VDD.

The metal wiring M6 is connected to the via plugs CT10 and CT10' (see FIG. 5). With this provision, the sauce diffusion region sn1 of the n-type MOS transistor cn1 and the sauce diffusion region sn2 of the n-type MOS transistor cn2 are coupled to the ground voltage VSS. Furthermore, via plugs CT11 and CT11' are formed. The via plugs CT11 and CT11' are coupled to the contact plugs CT8 and CT8' through the plug contacts M4 and M4' (see FIG. 5), respectively.

Furthermore, the word line WL is formed in parallel to the gate electrode g1 of the n-type MOS transistors sw1 and sw2. In this embodiment, the word line WL is formed as lining wiring in consideration of the resistance of the gate electrode g1, which makes it possible to drive multiple cells at a time (i.e., on a per-multiple-bit basis).

Figure 7:
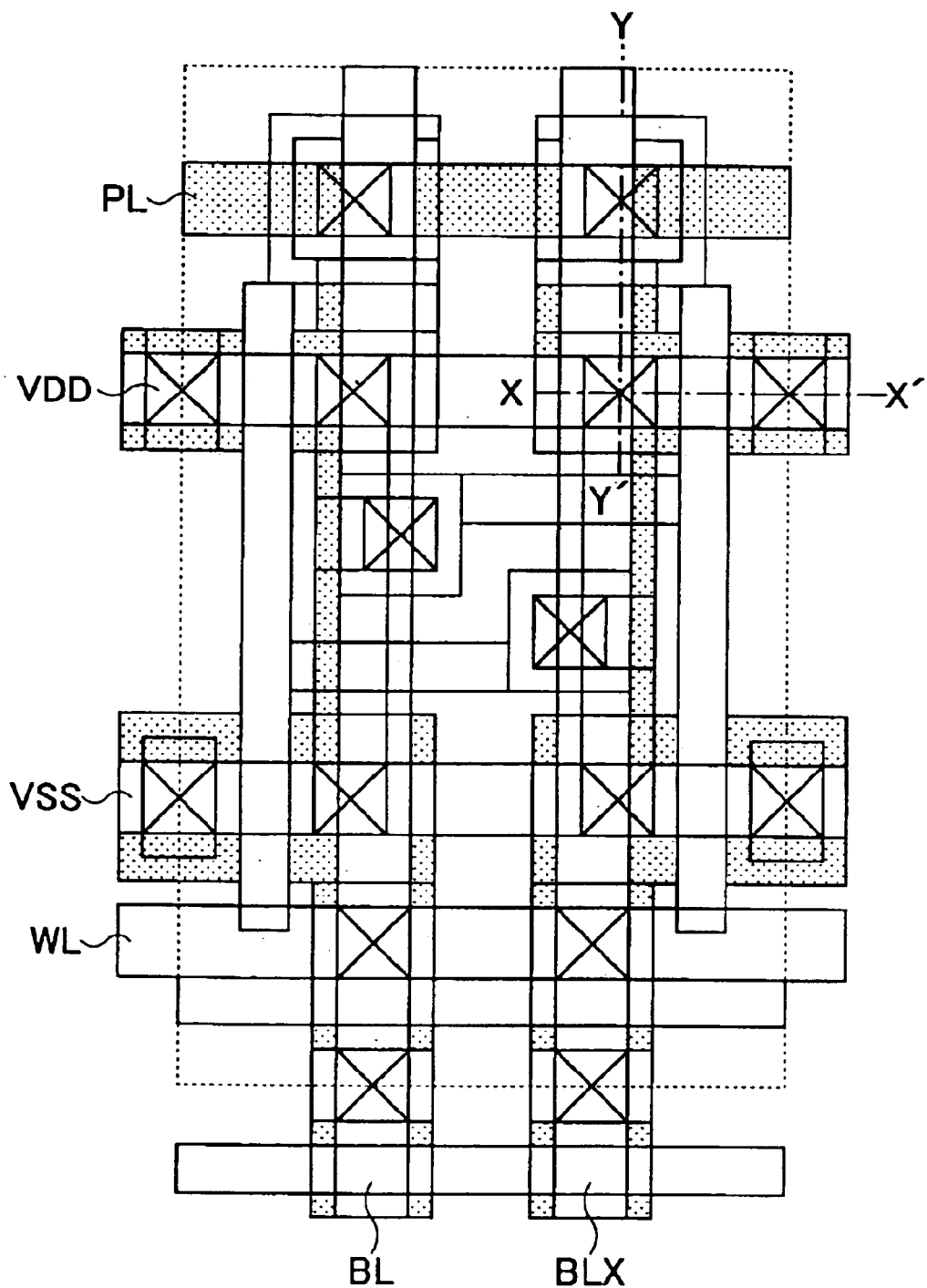
FIG. 7 is an illustrative drawing showing the sixth layout of the nonvolatile SRAM cell according to the first embodiment of the invention.

In the layout shown in FIG. 7, the bit lines BL and BLX are formed. The bit line BL is connected to the contact plug CT11. With this provision, the bit line BL is coupled to the sauce or drain diffusion region sd11 of the n-type MOS transistor sw1. Similarly, the bit line BLX is connected to the contact plug CT11'. The bit line BLX is thus coupled to the sauce or drain diffusion region sd21 of the n-type MOS transistor sw2.

In what follows, the process of manufacturing the stacked-layer structure shown in FIG. 2 through FIG. 7 will be described. This process may be performed by use of a well-known process technology.

With reference to FIG. 2, an N well (not shown) is first formed in the silicon substrate 1. This N well is formed in such a manner as to correspond to the p-type MOS transistors cp1 and cp2 of the respective CMOS inverters c1 and c2 and the regions exdp1 and exdp2 extending from the respective drain diffusion regions dp1 and dp2.

Thereafter, a P well (not shown) is formed in the silicon substrate 1. This P well is formed in such a manner as to correspond to the n-type MOS transistors cn1 and cn2 of the respective CMOS inverters c1 and c2 and the n-type MOS transistors sw1 and sw2. These N well and P well are made by a photolithography, a combination of high energy ion implantation and RTA (rapid thermal annealing), etc.

After this, device separating insulation films D0 (see FIGS. 8A and 8B) are formed. In this manufacturing process, first, device separating trenches are formed by photolithography around a region defined by the p well and the N well where a transistor is formed. Silicon dioxide (SiO2) or the like is embedded in the device separating trenches. The device separating insulation films D0 may as well be formed by the LOCOS (local oxidation of silicon) method or the like instead of the STI (shallow trench isolation) method.

Thereafter, the gate electrodes gp1 and gp2 of the respective CMOS inverters c1 and c2, the extending regions exgp1 and exgp2, and the gate electrode g1 of the n-type MOS transistors sw1 and sw2 are formed.

In this process, first, the surface of the silicon substrate 1 is covered with a dummy oxide film ($SiO_2$). Next, a resist pattern (not shown) is used to implant channel ion P+ or the like with respect to the p-type MOS transistors cp1 and cp2 of the respective CMOS inverters c1 and c2. Then, channel ion B+ or the like is implanted with respect to the n-type MOS transistors cn1 and cn2 and the n-type MOS transistors sw1 and sw2.

A gate oxide film is then deposited following the removal of the dummy insulation film by etching. In this embodiment, polysilicon is used as a gate electrode material. Resistance is lowered by silicide such as TiSi and CoSi. The gate electrodes gp1 and gp2 (inclusive of the regions exgp1 and exgp2) as well as g1 are patterned into the plane shape of respective electrodes, followed by etching.

Furthermore, the LDD (lightly doped drain) of both the P-type transistor and the N-type transistor may be subjected to photolithography and ion implantation from above the gate electrodes gp1 and gp2 (inclusive of the regions gxgp1 and exgp2) and the gate electrode g1. Before activating the LDD by heat treatment, a silicon dioxide film may be deposited by the CVD (chemical vapor deposition) or the like, and sidewalls may be formed on the surfaces of the gate electrode by etch back. After this, impurities for sauce and drain regions are injected into the silicon substrate 1 by photolithography and ion implantation. The diffusion layer of the LDD, the sauce, and the drain are simultaneously diffused through a single application of heat treatment.

With reference to FIG. 3, a first inter-layer insulation film D1 (see FIGS. 8A and 8B) is deposited first. That is, BPSG, a silicon nitride film, or a silicon dioxide film is deposited on the silicon substrate 1 after the process shown in FIG. 2 is completed. Heat treatment is then applied for the improvement of fineness, followed by a planarizing process by the chemical machine polishing (CMP) method.

Contact holes CTH1 and CTH1' are then formed. That is, photolithography is applied for the patterning of plane shapes of these contact holes, and the first inter-layer insulation film D0 is then etched, thereby forming the contact holes. Contact plugs CT1 and CT1' are then formed. Namely, barrier metal (Ti/TiN) is sputtered first in the contact holes CTH1 and CTH1'. Tungsten W serving as a plug material is then deposited by the CVD method or the like, followed by the planarizing process by the CMP method.

Thereafter, the ferroelectric capacitors fc1 and fc2 are formed. Namely, a first conductive film is formed as the lower electrodes BEL1 and BEL1' on the first inter-layer insulation film D1 and the contact plugs CT1 and CT1'. The first conductive film is made by stacking an iridium (Ir) film having a thickness of 200 nm, a platinum oxide (PtO) film having a thickness of 23 nm, and a platinum (Pt) film having a thickness of 50 nm, for example, by sputtering.

On the first conductive film, a PZT film is formed to a thickness of 200 nm, for example, as the ferroelectric films FER1 and FER2 by sputtering. The PZT film is then crystallized by annealing in the oxygen-content atmosphere. For this annealing, a RTA process may be used that includes a first step characterized by a mixed-gas atmosphere of argon (Ar) and oxygen ($O_2$), a substrate temperature of 600 degrees Celsius, and a time length of 90 seconds, and a second step of an oxygen-content atmosphere, a substrate temperature of 750 degrees Celsius, and a time length of 60 seconds.

On top of the PZT film, a second conductive film is formed as the upper electrodes TEL1 and TEL2. As the second conductive film, iridium dioxide ($IrO_2$) may be formed to a thickness of 200 nm by sputtering. On top of the second conductive film, then, a hard mask (not shown) is formed.

A pattern having the plane shape of ferroelectric capacitors is formed by photolithography. The second conductive film, the PZT film, and the first conductive film are successively etched at places where the hard mask does not cover. In this case, the PZT film is etched by sputter reaction in the halogen-content atmosphere.

After this etching process, the hard mask is removed, leaving the ferroelectric capacitor fc1 comprised of the lower electrode BEL1, the ferroelectric film FER1, and the upper electrode TER1, and the ferroelectric capacitor fc2 (see FIG. 8A) comprised of the lower electrode BEL2, the ferroelectric film FER2, and the upper electrode TEL2.

Following this, a second inter-layer insulation film D2 (see FIGS. 8A and 8B) is formed. This formation process is the same as that of the first inter-layer insulation film D1. That is, the insulation film D2 is deposited to cover the ferroelectric capacitors fc1 and fc2 and the first inter-layer insulation film D1. Heat treatment is applied for the improvement of fineness, and a planarizing process is performed by the CMP method.

With reference to FIG. 4, via holes CTH2 and CTH2' are formed first. That is, photolithography is applied for the patterning of plane shapes of these holes, and the second inter-layer insulation film D2 is then etched, thereby forming the via holes.

Via plugs CT2 and CT2' are then formed. Namely, barrier metal (Ti/TiN) is sputtered first in the via holes CTH2 and CTH2'. Tungsten serving as a plug material is then deposited by the CVD method or the like, followed by the planarizing process by the CMP method.

Next, contact holes CTH3–CTH8 and CTH3'–CTH8' are formed. That is, photolithography is applied for the patterning of plane shapes of these holes, and the second inter-layer insulation film D2 is then etched, thereby forming the contact holes. Subsequently, contact plugs CT3–CT8 and CT3'–CT8' are formed.

Namely, barrier metal (Ti/TiN) is sputtered first in the contact holes CTH3–CTH8 and CTH3'–CTH8'. Tungsten serving as a plug material is then deposited by the CVD method or the like, followed by a planarizing process by the CMP method.

With reference to FIG. 5, the plate line PL, the metal wiring M1 and M1, and the plug contacts M2, M2', M3, M3', M4, and M4' are formed. Layers made of a barrier metal (Ti/TiN), aluminum, and a barrier metal are successively formed on the second inter-layer insulation film D2 and the contact plugs CT3–CT8 and CT3'–CT8' by sputtering. Photolithography is then applied for the patterning of plane shape of the wiring, and etching is subsequently performed.

Thereafter, a third inter-later insulation film D3 (see FIGS. 8A and 8B) is formed. This formation process is the same as that of the first inter-layer insulation film D1. That is, the insulation film D3 is deposited to cover the plate line PL, the metal wiring M1 and M1', the plug contacts M2 and M2', and the second inter-layer insulation film D2. Heat treatment is applied for the improvement of fineness, and a planarizing process is performed by the CMP method.

After this, via holes CTH9–CTH10 and CTH9'–CTH10' are formed. That is, photolithography is applied for the patterning of plane shapes of these holes, and the third inter-layer insulation film D3 is then etched.

Via plugs CT9–CT10 and CT9'–CT10' are then formed. That is, barrier metal (Ti/TiN) is sputtered first in the via holes CTH9–CTH10 and CTH9'–CTH10'. Tungsten serving as a plug material is then deposited by the CVD method or the like, followed by a planarizing process by the CMP method.

With reference to FIG. 6, metal wiring M5 and M6 and the word line WL are formed first. Layers made of a barrier metal (Ti/TiN), aluminum, and a barrier metal are successively formed on the third inter-layer insulation film D3 and the via plugs CT9–CT10 and CT9'–CT10' by sputtering. Photolithography is then applied for the patterning of plane shape of the wiring, and etching is subsequently performed. As previously described, the word line WL is formed as lining wiring.

Thereafter, a fourth inter-layer insulation film D4 (see FIGS. 8A and 8B) is formed. Like the first inter-layer insulation film D1, this fourth inter-layer insulation film D4 is deposited to cover the metal wiring M5 and M6, the word line WL, and the third inter-layer insulation film D3. Heat treatment is then applied for the improvement of fineness, and a planarizing process is performed by the CMP method.

Next, contact holes CTH11 and CTH11' are formed. That is, photolithography is applied for the patterning of plane shapes of these holes, and the fourth inter-layer insulation film D4 is then etched, thereby forming the contact holes. Subsequently, contact plugs CT11 and CT11' are formed. Namely, barrier metal (Ti/TiN) is sputtered first in the contact holes CTH11 and CTH11'. Tungsten serving as a plug material is then deposited by the CVD method or the like, followed by a planarizing process by the CMP method.

With reference to FIG. 7, the bit lines BL and BLX are formed first. Layers made of a barrier metal (Ti/TiN), aluminum, and a barrier metal are successively formed on the fourth inter-layer insulation film D4 and the contact plugs CT11 and CT11' by sputtering. Photolithography is then applied for the patterning of plane shape of the wiring, and etching is subsequently performed.

Thereafter, a fifth inter-layer insulation film D5 (see FIGS. 8A and 8B) is formed. Like the first inter-layer insulation film D1, this fifth inter-layer insulation film D5 is deposited to cover the fourth inter-layer insulation film D4 and the bit lines BL and BLX. Heat treatment is then applied for the improvement of fineness, and a planarizing process is performed by the CMP method.

Figure 8A:
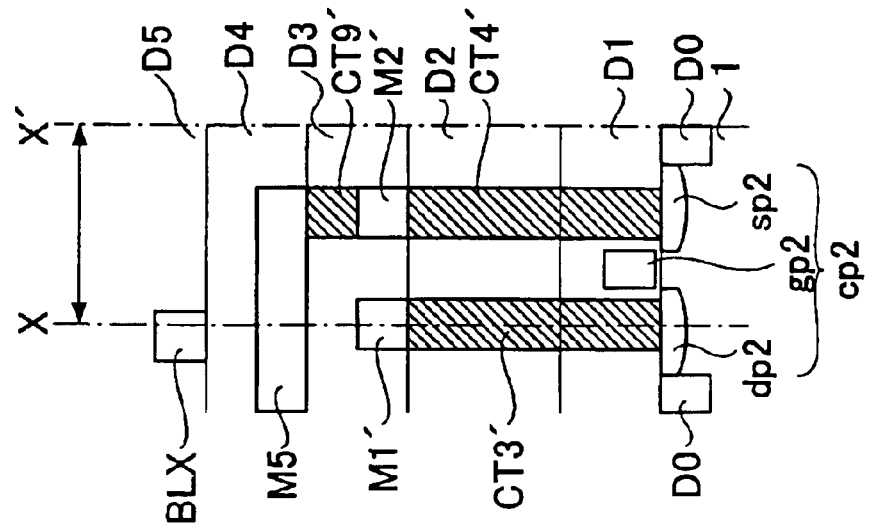
FIGS. 8A and 8B are cross-sectional views of the nonvolatile SRAM cell according to the first embodiment of the invention.
Figure 8B:
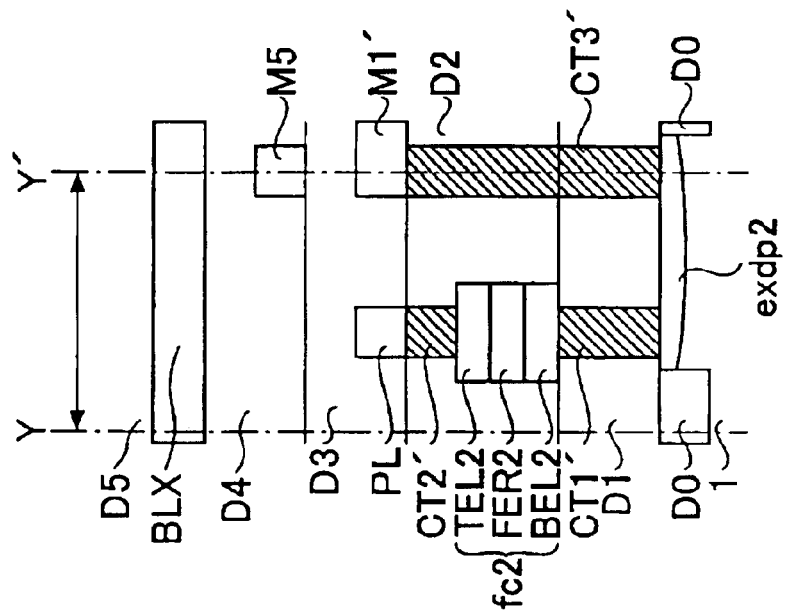

FIGS. 8A and 8B are cross-sectional views of the non-volatile SRAM cell according to the first embodiment of the invention. FIG. 8A shows a cross-sectional view taken along a line Y–Y' shown in FIG. 7.

In this cross-sectional structure, the region exdp2 extending as part of the drain diffusion region dp2 is formed in the silicon substrate 1. This region exdp2 is coupled to the lower electrode BEL2 of the ferroelectric capacitor fc2 through the contact plug CT1. The upper electrode TEL2 of the ferroelectric capacitor fc2 is coupled to the plate line PL through the via plug CT2'.

Moreover, the drain diffusion region dp2 is coupled to the metal wiring M1' through the contact plug CT3'. The metal wiring M5 coupled to the power supply voltage VDD is formed in the layer immediately above the layer in which the metal wiring M1' is formed. The bit line BLX is formed on the layer in which the metal wiring M5 is formed.

In this stacked-layer structure, the ferroelectric capacitors fc1 and fc2 are formed in a layer lower than the layer in which the bit lines BL and BLX or the plate line PL are formed. This order of stacked layers makes it possible to form the ferroelectric films (PZT films) FER1 and FER2 at a high temperature exceeding 600 degrees Celsius, thereby providing stable film quality.

To be specific, the cross-coupling connections of the latch circuit and the lower electrodes BEL1 and BEL2 are coupled together through the regions exdp1 and exdp2 extending from the drain diffusion regions dp1 and dp2. This provides for the ferroelectric film to be formed prior to the process of laying out metal wiring such as the bit lines BL and BLX. Furthermore, a nonvolatile memory that is stable in terms of manufacturing processes and circuit operations is achieved.

FIG. 8B shows a cross-sectional view taken along a line X–X' shown in FIG. 7. In this cross-sectional structure, the p-type MOS transistor cp2 is formed in the silicon substrate 1. The drain diffusion region dp2 of the p-type MOS transistor cp2 is coupled to the metal wiring M1' through the contact plug CT3'.

The sauce diffusion region sp2 is coupled to the metal wiring M5 through the contact plug CT4', the plug contact M2', and the via plug CT9'where the metal wiring M5 is coupled to the power supply voltage VDD. The bit line BLX is formed in the layer next higher than the layer in which the metal wiring M5 is formed.

In the following, other embodiments relating to the first embodiment will be described. In the embodiment described above (see FIG. 2), the regions exdp1 and exdp2 extending from the respective p-type MOS transistors cp1 and cp2 of the CMOS inverters c1 and c2 are provided as the storage nodes N and NX (see FIG. 1), respectively.

Alternatively, regions extending from the respective n-type MOS transistors cn1 and cn2 of the CMOS inverters c1 and c2 may be provided as the storage nodes N and NX, respectively. In this case, the ferroelectric capacitors fc1 and fc2 are formed in a layer above these regions, respectively.

Alternatively, a region extending from the drain diffusion region dp1 of the p-type MOS transistor cp1 and a region extending from the drain diffusion region dn2 of the n-type MOS inverter cn2 may be provided as the storage nodes N and NX, respectively. By the same token, a region extending from the drain diffusion region dn1 of the n-type MOS transistor cn1 and a region extending from the drain diffusion region dp2 of the p-type MOS transistor cp2 may be provided as the storage nodes N and NX, respectively.

In the embodiments of the invention, the lower electrodes BEL1 and BEL2 of the respective ferroelectric capacitors fc1 and fc2 are coupled to the regions extending from the impurity diffusion regions of the transistors which constitute the latch circuit where these impurity diffusion regions (e.g., dp1, dn1, dp2, and dn2) are different from the impurity diffusion regions (e.g., sp1, sn1, sp2, and sn2) coupled to the power supply voltage VDD or the ground voltage VSS.

To be specific, the lower electrodes BEL1 and BEL2 of the respective ferroelectric capacitors fc1 and fc2 are coupled to the regions extending from the drain diffusion regions of the two respective inverters c1 and c2 where these drain diffusion regions are different from the drain diffusion regions coupled to the power supply voltage VDD or the ground voltage VSS.

Specifically, the lower electrode BEL1 is coupled to a region extending from either the drain diffusion region dp1 or the drain diffusion region dn1. Further, the lower electrode BEL2 is coupled to a region extending from either the drain diffusion region dp2 or the drain diffusion region dn2.

In the embodiments of the invention, moreover, the regions exdp1 and exdp2 extending from the respective p-type MOS transistors cp1 and cp2 of the CMOS inverters c1 and c2 are formed outside the area (see FIG. 5) defined by the points A1, A2, A3, and A4. As an alternative arrangement, these extending regions may be provided inside the defined region.

The nonvolatile SRAM cells according to the first embodiment and also according to other embodiments described above are provided as having a stacked-layer structure that attains stable ferroelectric films for the ferroelectric capacitors fc1 and fc2 and stable circuit operations.

FIG. 9 through FIG. 16 show the layout of the nonvolatile SRAM cell according to the second embodiment of the invention. Steps by which device elements are stacked one over another are shown in FIG. 9 through FIG. 16. The layout illustrated in FIG. 9 through FIG. 16 will be described with reference to the circuit connections shown in FIG. 1. In these drawings, the same elements as those of the first embodiments are referred to by the same numerals, and a description of arrangement and functions will be omitted.

Figure 9:
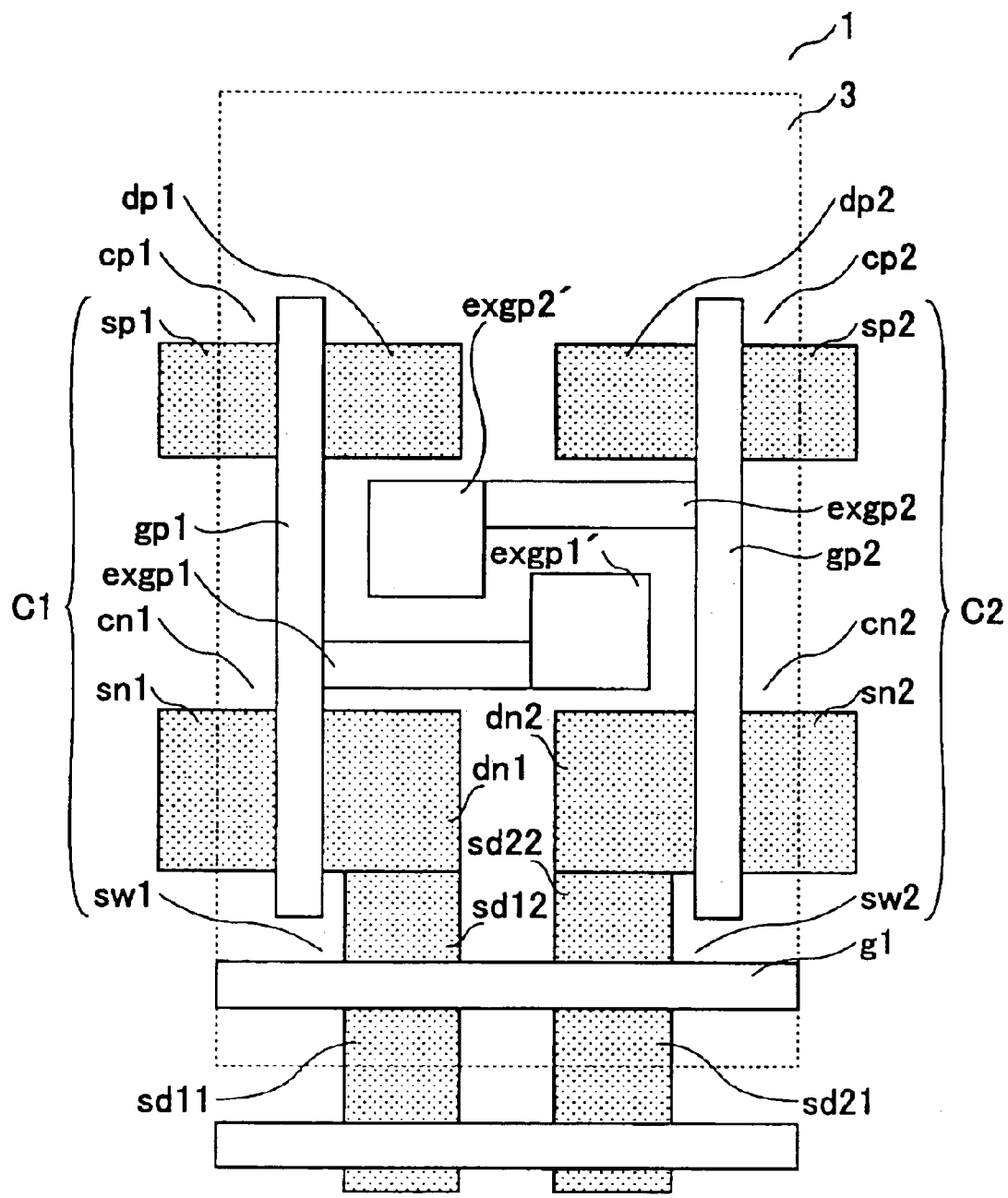
FIG. 9 is an illustrative drawing showing the first layout of a nonvolatile SRAM cell according to a second embodiment of the invention.

The layout shown in FIG. 9 corresponds to that of FIG. 2 of the first embodiment. FIG. 9 differs from FIG. 2 in that no regions extend from the drain diffusion regions dp1 and dp2 of the respective p-type MOS transistors cp1 and cp2 of the CMOS inverters c1 and c2.

In the silicon substrate 1, the CMOS inverters c1 and c2 are formed. These CMOS inverters c1 and c2 are situated at line-symmetrical positions with respect to the center line Z–Z' which extends parallel to the direction in which the respective gate electrodes gp1 and gp2 are formed.

The gate electrode gp1 (gp2) of the CMOS inverter c1 (c2) has the region exgp1 (exgp2) extending toward the opposite gate electrode gp2 (gp1) until it reaches a point between the two drain diffusion regions dp2 and dn2 (dp1 and dn1) connected to the opposite gate electrode.

In the same manner as in the first embodiment, the region exgp1 is not directly connected to the drain diffusion regions dp2 and dn2 on the silicon substrate 1 for the purpose of forming the cross-coupling connection for the CMOS inverter c2. In association with the region exgp1, a region exgp1' is provided in order to form the plug CT14 (see FIG. 10) for providing electrical coupling between the gate electrode gp1 and the drain diffusion regions dp2 and dn2 in a layer above the silicon substrate 1.

By the same token, the region exgp2 is not directly connected to the drain diffusion regions dp1 and dn1 on the silicon substrate 1 for the purpose of forming the cross-coupling connection for the CMOS inverter c1. In association with the region exgp2, a region exgp2' is provided in order to form the plug CT14' (see FIG. 10) for providing electrical coupling between the gate electrode gp2 and the drain diffusion regions dp1 and dn1 in a layer above the silicon substrate 1.

The structure and arrangement of the extending-regions exgp1 and exgp2 are defined such as to provide cross-coupling connections specific to the stacked-layer structure of the present invention in which the CMOS inverters c1 and c2, the ferroelectric capacitors fc1 and fc2, and the metal wiring such as bit lines are formed one over another in the order named.

Figure 10:
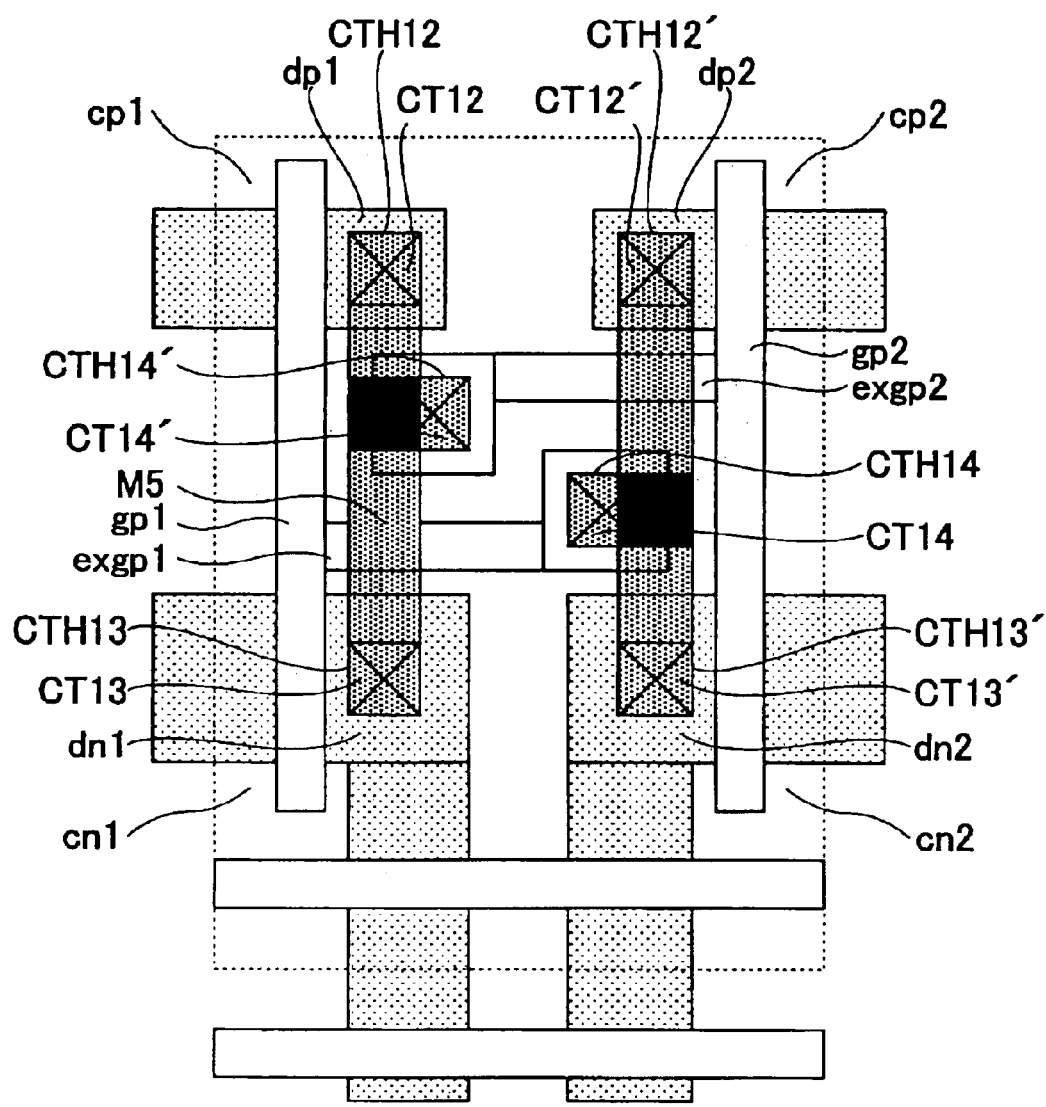
FIG. 10 is an illustrative drawing showing the second layout of the nonvolatile SRAM cell according to the second embodiment of the invention.

In the layout shown in FIG. 10, contact plugs CT12–CT14 and CT12'–CT14' and local wiring M5 and M5' are formed. These contact plugs are connected to the electrodes or diffusion regions of the MOS transistors formed in the silicon substrate 1.

To be specific, the contact plug CT12 is formed, corresponding to the drain diffusion region dp1 of the p-type MOS transistor cp1. The contact plug CT13' is formed, corresponding to the drain diffusion region dn1 of the n-type MOS transistor cn1.

Similarly, the contact plug CT12' is formed, corresponding to the drain diffusion region dp2 of the p-type MOS transistor cp2. The contact plug CT13' is formed, corresponding to the drain diffusion region dn2 of the n-type MOS transistor cn2.

Furthermore, the contact plug CT14 is formed, corresponding to the region exgp1 extending from the gate electrode gp1. By the same token, the contact plug CT14' is formed, corresponding to the region exgp2 extending from the gate electrode gp2.

The local wiring M5 connects between the drain diffusion region dp1 of the p-type MOS transistor cp1 and the drain diffusion region dn1 of the n-type MOS transistor cn1. The region exgp2 extends such as to be situated substantially straight below the local wiring M5. With this provision, the drain diffusion regions dp1 and dn1 and the gate electrode gp2 are connected together through the contact plug-CT14'.

By the same token, the local wiring M5' connects between the drain diffusion region dp2 of the p-type MOS transistor cp2 and the drain diffusion region dn2 of the n-type MOS transistor cn2. The region exgp1 extends such as to be situated substantially straight below the local wiring M5'.

With this provision, the drain diffusion regions dp2 and dn2 and the gate electrode gp1 are connected together through the contact plug CT14'. The local wiring M5 and M5' and the regions exgp2 and exgp1 together make up the cross-coupling connections of the latch circuit (see FIG. 1).

In this embodiment, if aluminum or copper is used for the metal wiring of bit lines and plate lines, polysilicon, silicide (tungsten silicide, titanium silicide, cobalt silicide), or the like may be used for the local wiring M5 and M5'.

Figure 11:
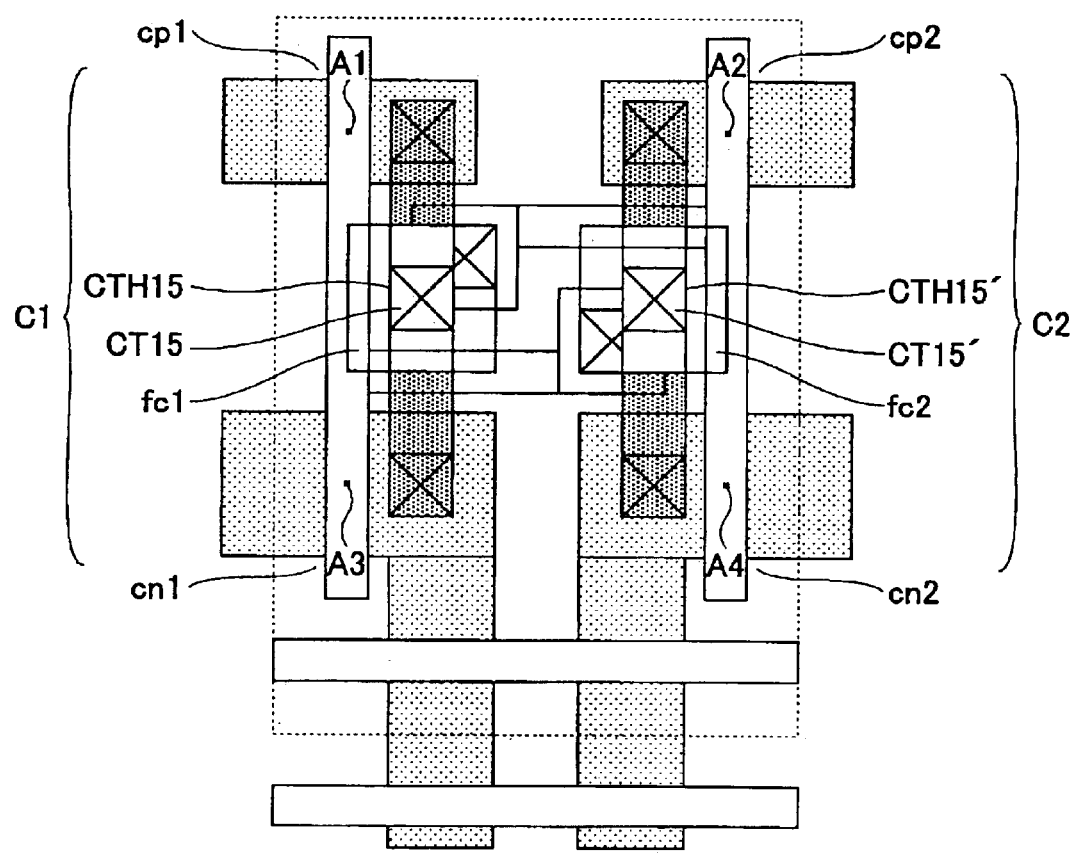
FIG. 11 is an illustrative drawing showing the third layout of the nonvolatile SRAM cell according to the second embodiment of the invention.

In the layout shown in FIG. 11, the via plug CT15 and CT15' are formed. The via plug CT15 is coupled to the contact plug CT14 through the local wiring M5 (see FIG. 10). The via plug CT15 is connected to the lower electrode BEL1 of the ferroelectric capacitor fc1. The ferroelectric capacitor fc1 is comprised of the lower electrode BEL1, the ferroelectric film FER1, and the upper electrode TEL1 (see FIG. 17A).

By the same token, the via plug CT15' is coupled to the contact plug CT14' through the local wiring M5'. The via plug CT15' is connected to the lower electrode BEL2 of the ferroelectric capacitor fc2. The ferroelectric capacitor fc2 is comprised of the lower electrode BEL2, the ferroelectric film FER2, and the upper electrode TEL2.

In this embodiment, the drain diffusion region dp1 of the p-type MOS transistor cp1 and the drain diffusion region dn1 of the n-type MOS transistor cn1 of the CMOS inverter c1 are laid out in a layer situated below the layer in which the ferroelectric capacitor fc1 is formed. Similarly, the drain diffusion region dp2 of the p-type MOS transistor cp2 and the drain diffusion region dn2 of the n-type MOS transistor cn2 of the CMOS inverter c2 are laid out in a layer situated below the layer in which the ferroelectric capacitor fc2 is formed.

In this embodiment, the ferroelectric capacitors fc1 and fc2 are formed inside a plane area (e.g., a rectangular area having vertexes A1, A2, A3, and A4) defined by the transistors cp2, cn1, cp2, and cn2, which make up the two CMOS inverters c1 and c2. This provision achieves a nonvolatile SRAM cell having a small area size.

Figure 12:
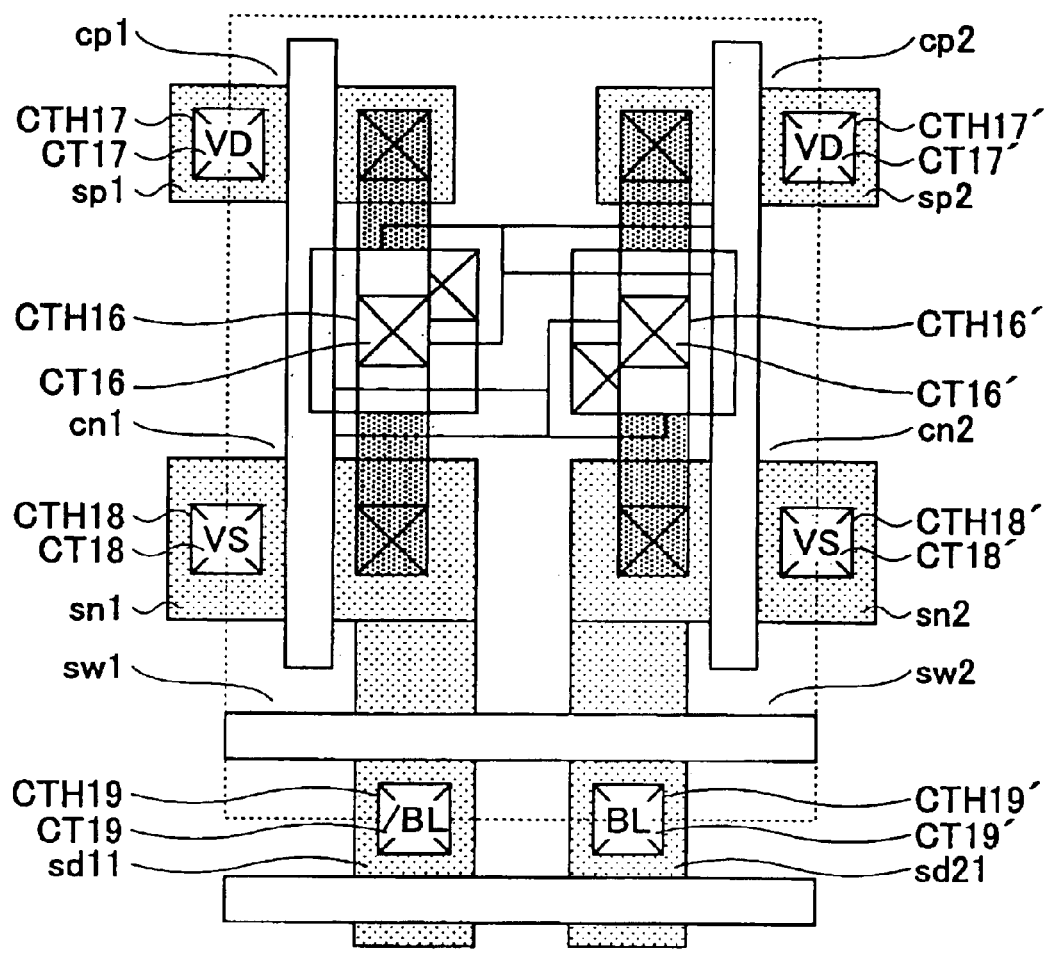
FIG. 12 is an illustrative drawing showing the fourth layout of the nonvolatile SRAM cell according to the second embodiment of the invention.

The layout shown in FIG. 12, via plugs CT16 and CT16' and contact plugs CT17–CT19 and CT17'–CT19' are formed. Specifically, the via plug CT16 is formed on the upper electrode TEL1 (see FIG. 17A).

The via plug CT16 is situated substantially straight above the contact plug CT15 through the intervening ferroelectric capacitor fc1. Furthermore, the via plug CT16' is formed on the upper electrode TEL2. The via plug CT16' is situated substantially straight above the contact plug CT15' through the intervening ferroelectric capacitor fc2.

The contact plugs CT17–CT19 and CT17'–CT19' are coupled to the electrodes or diffusion regions of the MOS transistors formed in the silicon substrate 1. Specifically, the contact plug CT17 is formed, corresponding to the sauce diffusion region sp1 of the p-type MOS transistor cp1. Moreover, the contact plug CT18 is formed, corresponding to the sauce diffusion region sn1 of the n-type MOS transistor cn1.

Similarly, the contact plug CT17' is formed, corresponding to the sauce diffusion region sp2 of the p-type MOS transistor cp2. The contact plug CT18' is formed, corresponding to the sauce diffusion region sn2 of the n-type MOS transistor cn2.

Furthermore, the contact plug CT19 is formed, corresponding to the sauce or drain diffusion region sd11 of the n-type MOS transistor sw1. By the same token, the contact plug CT19' is formed, corresponding to the sauce or drain diffusion region sd21 of the n-type MOS transistor sw2.

Figure 13:
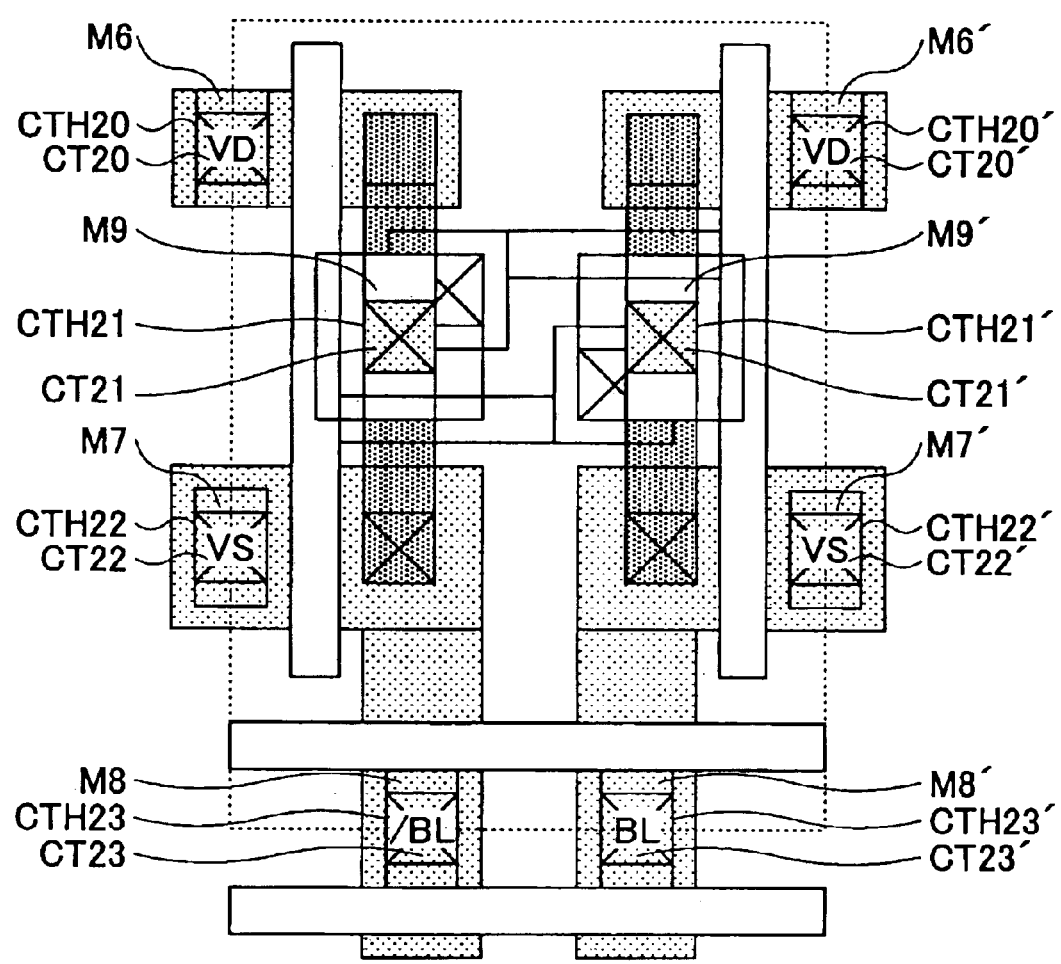
FIG. 13 is an illustrative drawing showing the fifth layout of the nonvolatile SRAM cell according to the second embodiment of the invention.

In the layout shown in FIG. 13, the plug contacts M6–M9 and M6'–M9' are formed. The plug contact M6 connects a via plug CT20 that is to be subsequently formed to the contact plug CT17 (see FIG. 12). Similarly, the plug contact M6' connects a via plug CT20' that is to be subsequently formed to the contact plug CT17'.

The plug contact M7 connects a via plug CT22 that is to be subsequently formed to the contact plug CT18. Similarly, the plug contact M7' connects a via plug CT22' that is to be subsequently formed to the contact plug CT18'.

The plug contact M8 connects a via plug CT23 that is to be subsequently formed to the contact plug CT19. Similarly, the plug contact M8' connects a via plug CT23' that is to be subsequently formed to the contact plug CT19'.

The plug contact M9 connects a via plug CT21 that is to be subsequently formed to the contact plug CT16. Similarly, the plug contact M9' connects a via plug CT21' that is to be subsequently formed to the contact plug CT16'.

Figure 14:
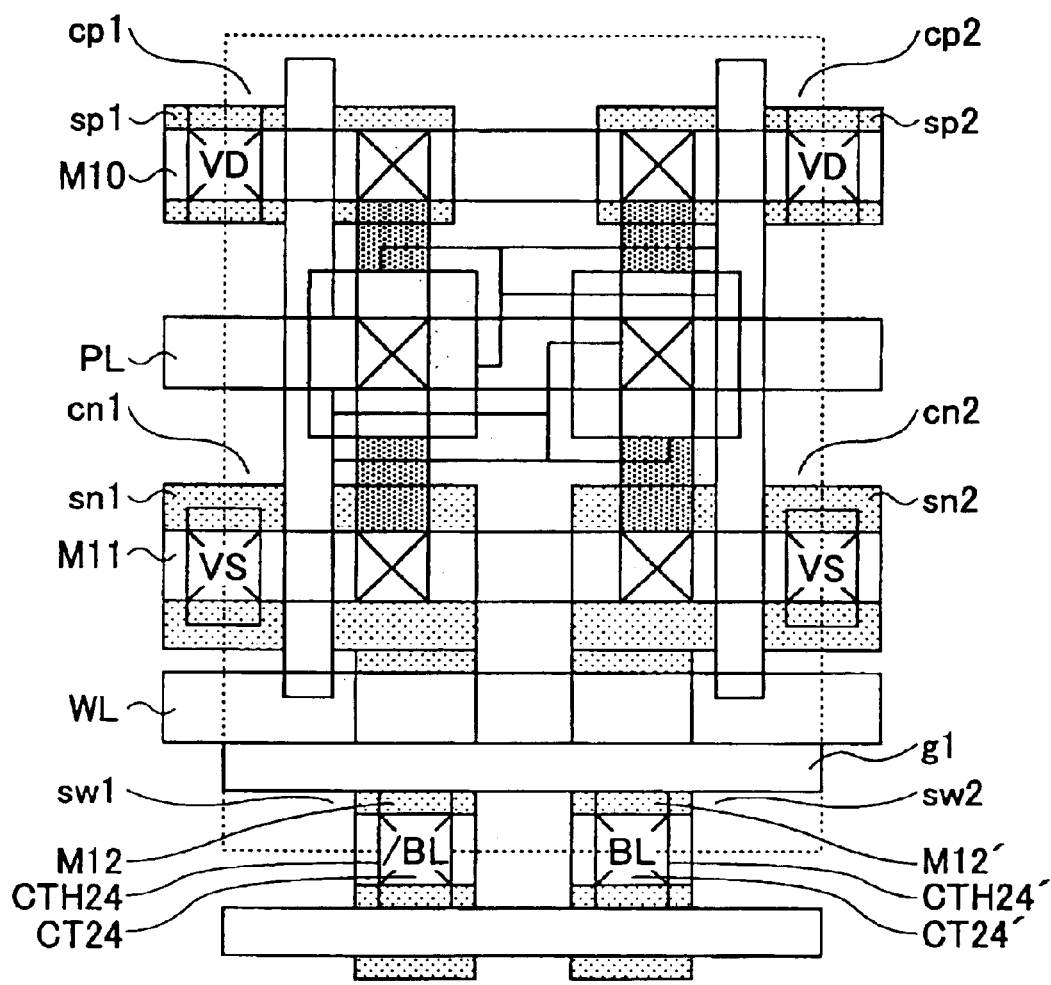
FIG. 14 is an illustrative drawing showing the sixth layout of the nonvolatile SRAM cell according to the second embodiment of the invention.

In the layout shown in FIG. 14, metal wiring M10 coupled to the power supply voltage VDD, metal wiring M11 coupled to the ground voltage VSS, the plate line PL, the word line WL, and plug contacts CT24 and CT24' are formed.

The metal wiring M10 connects the via plugs CT20 and CT20' (see FIG. 13). With this provision, the sauce diffusion region sp1 of the p-type MOS transistor cp1 and the sauce diffusion region sp2 of the p-type MOS transistor cp2 are coupled to the power supply voltage VDD.

Moreover, the metal wiring M11 connects the via plugs CT22 and CT22' (see FIG. 13). In this manner, the sauce diffusion region sn1 of the n-type MOS transistor cn1 and the sauce diffusion region sn2 of the n-type MOS transistor cn2 are coupled to the ground voltage VSS.

Moreover, the plate line PL is coupled to the contacts CT21 and CT21' (see FIG. 13). With this construction, the plate line PL is coupled to the upper electrodes TEL1 and TEL2 of the respective ferroelectric capacitors fc1 and fc2 through the respective contacts CT21 and CT21'.

The plug contact M12 electrically connects the via plug CT24 that is to be subsequently formed to the contact plug CT23 (see FIG. 13). Similarly, the plug contact M12' connects the via plug CT24' that is to be subsequently formed to the contact plug CT23'.

Furthermore, the word line WL is formed in parallel to the gate electrode g1 of the n-type MOS transistors sw1 and sw2. In the same manner as in the first embodiment, the word line WL is formed as lining wiring in consideration of resistance of the gate electrode g1, which makes it possible to drive multiple cells at a time (i.e., on a per-multiple-bit basis).

Figure 15:
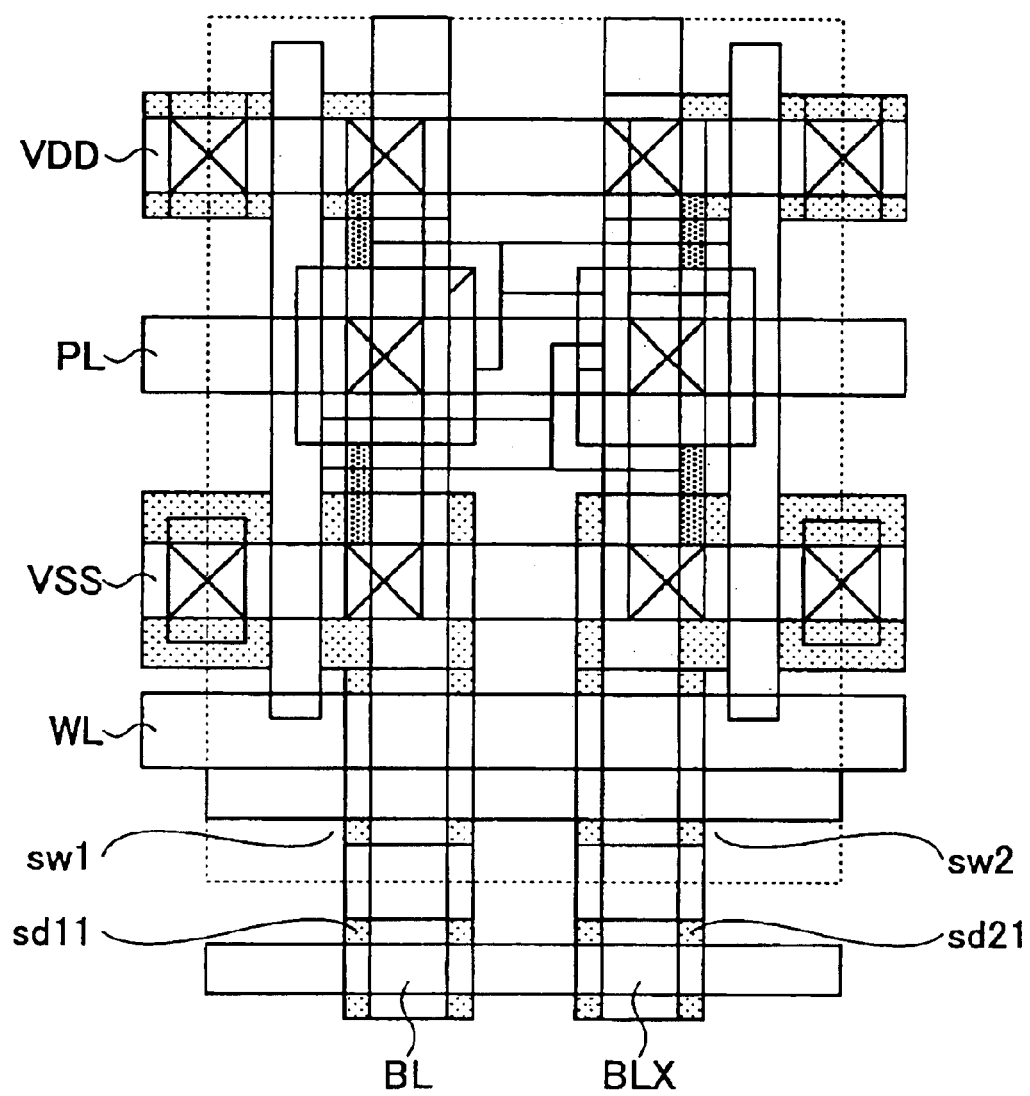
FIG. 15 is an illustrative drawing showing the seventh layout of the nonvolatile SRAM cell according to the second embodiment of the invention.

In the layout shown in FIG. 15, the bit lines BL and BLX are formed. The bit line BL is connected to the via plug CT24, and the bit line BLX is connected to the via plug CT24'. With this provision, the bit line BL is coupled to the sauce or drain diffusion region sd11 of the n-type MOS transistor sw1. Similarly, the bit line BLX is coupled to the sauce or drain diffusion region sd21 of the n-type MOS transistor sw2.

In the following, the process of manufacturing the stacked-layer structure shown in FIG. 9 through FIG. 15 will be described. With reference to FIG. 9, the device structure shown in FIG. 9 is obtained by removing the regions exdp1 and exdp2 from the structure shown in FIG. 2. Because of this, the process of manufacturing the structure shown in FIG. 9 is the same as before, except for the omission of a process that forms these regions simultaneously with the gate electrodes.

With reference to FIG. 10 and FIG. 11, a first inter-layer insulation film D1' (see FIGS. 17A and 17B) is formed first. That is, BPSG, a silicon nitride film, or a silicon dioxide film is deposited on the silicon substrate 1 shown in FIG. 9. Heat treatment is then applied for the improvement of fineness, followed by a planarizing process by the chemical machine polishing (CMP) method.

Contact holes CTH12–CTH14 and CTH12'–CTH14' are then formed. That is, photolithography is applied for the patterning of plane shapes of these contact holes, and the first inter-layer insulation film D1' is then etched.

The contact plugs CT12–CT14 and CT12'–CT14' are then formed. Namely, barrier metal (Ti/TiN) is sputtered first in the contact holes CTH12–CTH14 and CTH12'–CTH14'. Tungsten W serving as a plug material is then deposited by the CVD method or the like, followed by a planarizing process by the CMP method.

Thereafter, the local wiring M5 and M5' are formed. Namely, polysilicon or the like is deposited by the CVD method first. Photolithography is then applied for the patterning of plane shapes of the local wiring M5 and M5', followed by etching.

Following this, a first inter-layer insulation film D1" (see FIGS. 17A and 17B) is formed. This formation process is the same as that of the first inter-layer insulation film D1'. The insulation film D1" is deposited to cover the local wiring M5 and M5' and the first inter-layer insulation film D1'. Heat treatment is then applied for the improvement of fineness, and a planarizing process is performed by the CMP method.

After this, the via holes CTH15 and CTH15' are formed. That is, photolithography is applied for the patterning of plane shapes of these holes, and the first inter-layer insulation film D1' is then etched. The via plugs CT15 and CT15' are then formed. Namely, barrier metal (Ti/TiN) is sputtered first in the via holes CTH15 and CTH15'. Tungsten serving as a plug material is then deposited by the CVD method or the like, followed by the planarizing process by the CMP method.

The ferroelectric capacitors fc1 and fc2 are thereafter formed. This formation process is the same as that of the first embodiment previously described. After this process, a second inter-layer insulation film D2 is formed. This formation process is the same as that of the first inter-layer insulation film D1'. That is, the insulation film D2 is deposited to cover the ferroelectric capacitors fc1 and fc2 and the first inter-layer insulation film D1". Heat treatment is applied for the improvement of fineness, and a planarizing process is performed by the CMP method.

With reference to FIG. 12, via holes CTH16 and CTH16' are formed first. That is, photolithography is applied for the patterning of plane shapes of the via holes CTH16 and CTH16', and the second inter-layer insulation film D2 is then etched.

The via plugs CT16 and CT16' are then formed. Namely, barrier metal (Ti/TiN) is sputtered first in the via holes CTH16 and CTH16'. Tungsten W serving as a plug material is then deposited by the CVD method or the like, followed by a planarizing process by the CMP method.

Next, contact holes CTH17–CTH19 and CTH17'–CTH19' are formed. That is, photolithography is applied for the patterning of plane shapes of these holes. The second inter-layer insulation film D2 and the first inter-layer insulation film D1' and D1" are then etched.

The contact holes CTH17–CTH19 and CTH17'–CTH19' are then formed. Namely, barrier metal (Ti/TiN) is sputtered first in the contact holes CTH17–CTH19 and CTH17'–CTH19'. Subsequently, tungsten W serving as a plug material is deposited by the CVD method or the like, followed by a planarizing process by the CMP method.

With reference to FIG. 13, the plug contacts M6–M9 and M6'–M9' are formed first. Layers made of a barrier metal (Ti/TiN), aluminum, and a barrier metal are successively formed on the second inter-layer insulation film D2, the via plugs CT16 and CT16', and the contact plugs CT17–CT19 and CT17'–CT19' by sputtering. Photolithography is then applied for the patterning of plane shape of the plug contacts, and etching is subsequently performed.

Thereafter, a third inter-later insulation film D3 is formed. This formation process is the same as that of the first inter-layer insulation film D1. That is, the insulation film D3 is deposited to cover the plug contacts M6–M9 and M6'–M9' and the second inter-layer insulation film D2. Heat treatment is applied for the improvement of fineness, and a planarizing process is performed by the CMP method.

After this, via holes CTH20–CTH23 and CTH20'–CTH23' are formed. That is, photolithography is applied for the patterning of plane shapes of these via holes, and the third inter-layer insulation film D3 is then etched.

The via plugs CT20–CT23 and CT20'–CT23' are then formed. That is, barrier metal (Ti/TiN) is sputtered first in the via holes CTH20–CTH23 and CTH20'–CTH23'. Tungsten W serving as a plug material is then deposited by the CVD method or the like, followed by a planarizing process by the CMP method.

With reference to FIG. 14, the metal wiring M10 and M11, the plate line PL, the word line WL, and the plug contacts 12 and 12' are formed first. Layers made of a barrier metal (Ti/TIN) aluminum, and a barrier metal are successively formed on the third inter-layer insulation film D3 and the via plugs CT20–CT23 and CT20'–CT23' by sputtering. Photolithography is then applied for the patterning of plane shape of the wiring and the plug contacts, and etching is subsequently performed. As previously described, the word line WL is formed as lining wiring.

Thereafter, a fourth inter-layer insulation film D4 (see FIGS. 17A and 17B) is formed. Like the first inter-layer insulation film D1, this fourth inter-layer insulation film D4 is deposited to cover the metal wiring M10 and M11, the plate line PL, the word line WL, the plug contacts 12 and 12', and the third inter-layer insulation film D3. Heat treatment is then applied for the improvement of fineness, and a planarizing process is performed by the CMP method.

Next, via holes CTH24 and CTH24' are formed. That is, photolithography is applied for the patterning of plane shapes of the via holes CTH24 and CTH24', and the fourth inter-layer insulation film D4 is then etched.

Subsequently, the via plugs CT24 and CT24' are formed. Namely, barrier metal (Ti/TiN) is sputtered first in the via holes CTH24 and CTH24'. Tungsten W serving as a plug material is then deposited by the CVD method or the like, followed by a planarizing process by the CMP method.

With reference to FIG. 15, the bit lines BL and BLX are formed first. Layers made of a barrier metal (Ti/TiN), aluminum, and a barrier metal are successively formed on the fourth inter-layer insulation film D4 and the via plugs CT24 and CT24' by sputtering. Photolithography is then applied for the patterning of plane shape of the bit lines BL and BLX, and etching is subsequently performed.

Thereafter, a fifth inter-layer insulation film D5 is formed. By the process similar to that of depositing the first inter-layer insulation film D1, the fifth inter-layer insulation film D5 is deposited to cover the fourth inter-layer insulation film D4 and the bit lines BL and BLX. Heat treatment is then applied for the improvement of fineness, and a planarizing process is performed by the CMP method.

Figure 16:
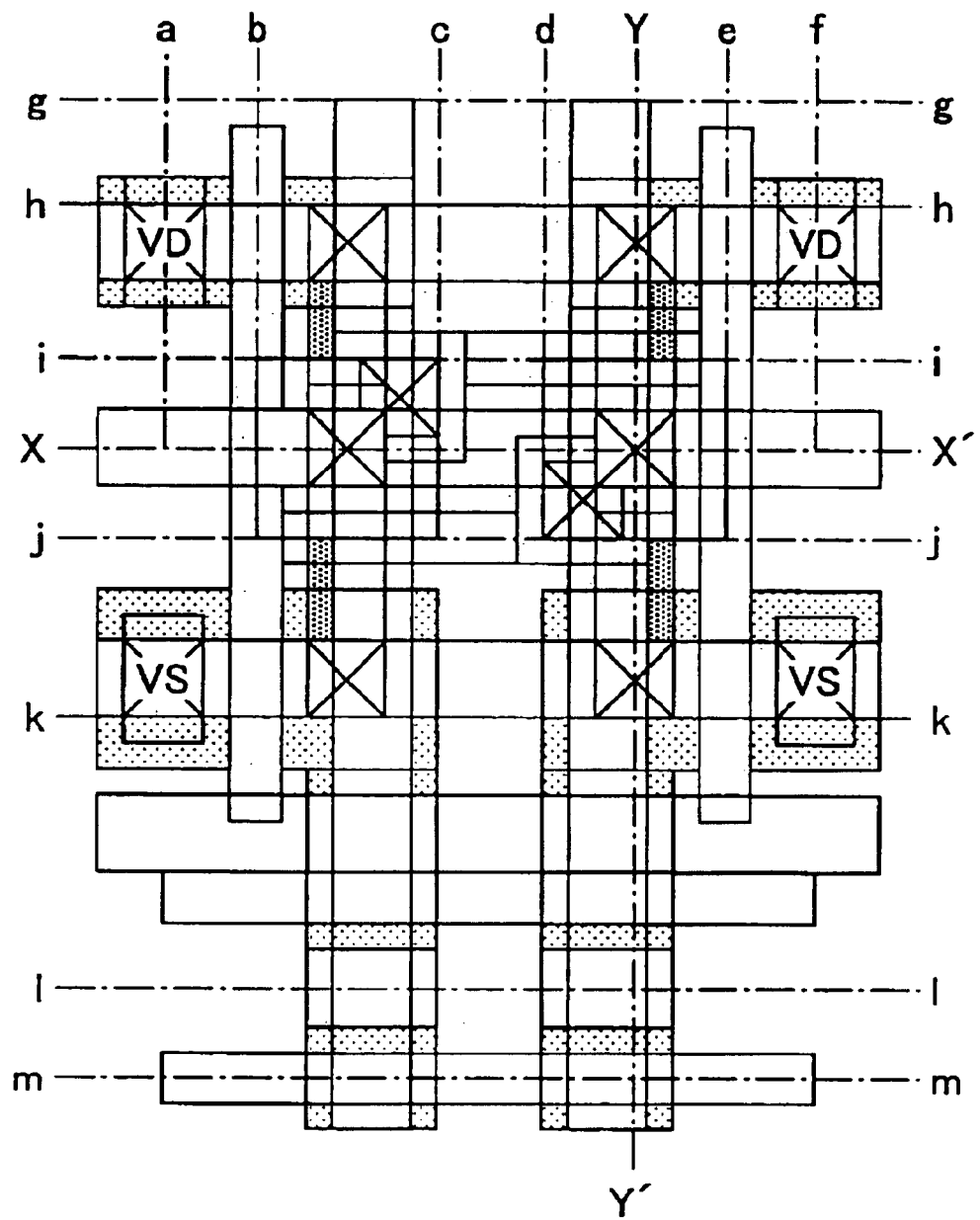
FIG. 16 is an illustrative drawing showing the eighth layout of the nonvolatile SRAM cell according to the second embodiment of the invention.

FIG. 16 is an illustrative drawing showing the layout of the nonvolatile SRAM cell according to the embodiment. In FIG. 16, grids a–f extending in a vertical direction and grids g–m extending in a horizontal direction are illustrated for the purpose of checking the stacked-layer structure.

Figure 17B:
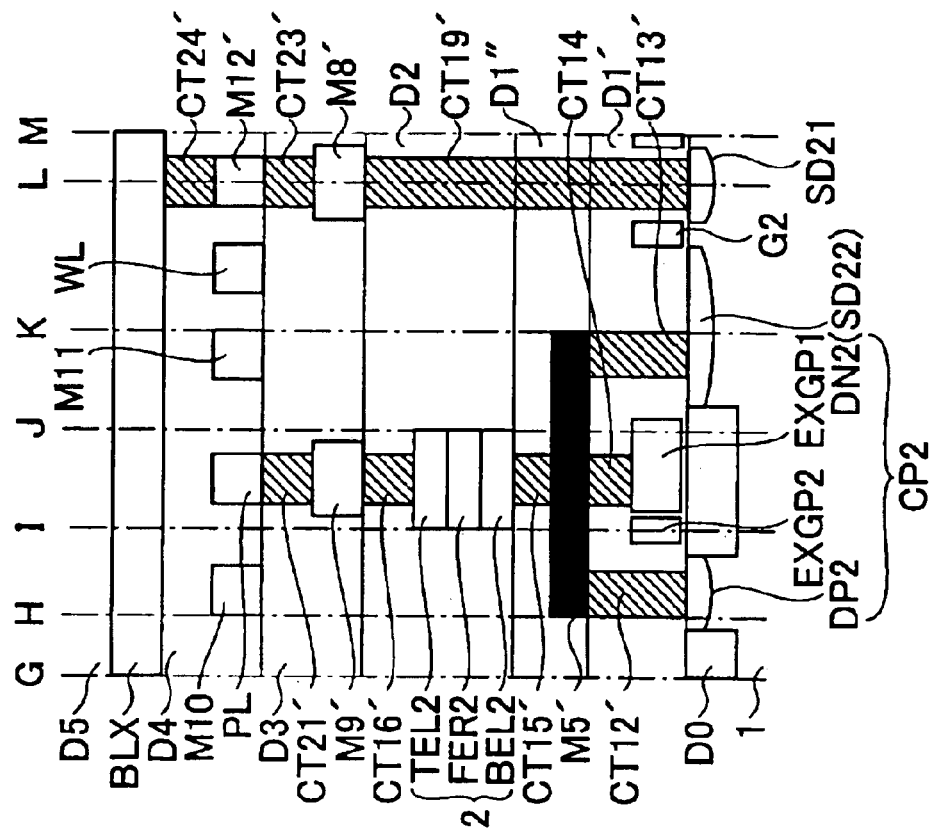
FIGS. 17A and 17B are cross-sectional views of the nonvolatile SRAM cell according to the second embodiment.
Figure 17A:
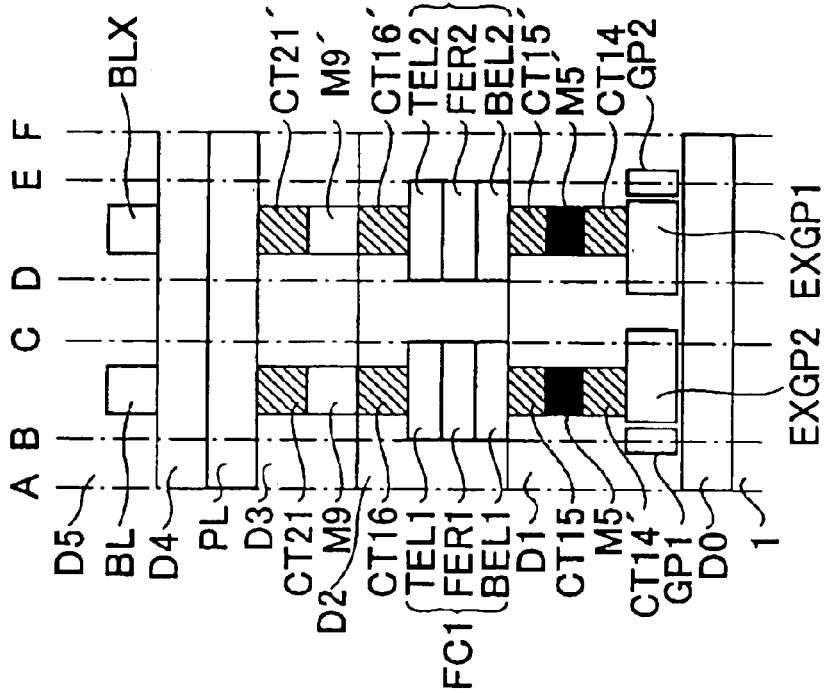

FIGS. 17A and 17B are cross-sectional views of the nonvolatile SRAM cell according to this embodiment. FIG. 17A shows a cross-sectional view taken along a line X–X' shown in FIG. 16, and FIG. 17B illustrates a cross-sectional view taken along a line Y—Y.

In FIG. 17A, the region exgp2 extending from the gate electrode gp2 of the CMOS inverter c2 is coupled to the local wiring M5 through the contact plug CT14'. The local wiring M5 is coupled to the lower electrode BEL1 of the ferroelectric capacitor fc1 through the via plug CT15.

The upper electrode TEL1 of the ferroelectric capacitor fc1 is coupled to the plate line PL through the via plug CT16, the plug contact M9, and the via plug CT21. The bit line BL is formed in a direction perpendicular to the plate line PL, with the fourth inter-layer insulation film D4 intervening therebetween.

Similarly, the region exgp1 extending from the gate electrode gp1 of the CMOS inverter c1 is coupled to the local wiring M5' through the contact plug CT14. The local wiring M5' is coupled to the lower electrode BEL2 of the ferroelectric capacitor fc2 through the via plug CT15'.

The upper electrode TEL2 of the ferroelectric capacitor fc2 is coupled to the plate line PL through the via plug CT16', the plug contact M9', and the via plug CT21'. The bit line BLX is formed in a direction perpendicular to the plate line PL, with the fourth inter-layer insulation film D4 intervening therebetween.

In FIG. 17B, the drain diffusion region dp2 of the p-type MOS transistor cp2 of the CMOS inverter c2 and the drain diffusion region dn2 of the n-type MOS transistor cn2 are coupled to the local wiring M5' through the contact plugs CT12' and CT13'. The local wiring M5' is coupled to the region exgp1 extending from the gate electrode gp1 through the contact plug CT14.

The local wiring M5' is coupled to the lower electrode BEL2 of the ferroelectric capacitor fc2 through the via plug CT15'. The upper electrode TEL2 of the ferroelectric capacitor fc2 is coupled to the plate line PL through the via plug CT16', the plug contact M9', and the via plug CT21'. In the layer where the plate line PL is provided, the metal wiring M10 and M11 and the word line WL are formed so as to extend in a direction parallel to the plate line PL.

Moreover, the source or drain diffusion region sd21 of the n-type MOS transistor sw2 is coupled to the bit line BLX through the contact plug CT19', the plug contact M8', the via plug CT23', the plug contact M12', and the via plug CT24'. The bit line BLX extends in a direction perpendicular to the direction in which the plate line PL, the metal wiring M10' and M11', and the word line WL are formed.

In the nonvolatile SRAM cell according to this embodiment, the ferroelectric capacitors fc1 and fc2 are provided in a layer situated below the, layer in which the metal wiring of the bit lines BL and BLX and the plate line is formed. Furthermore, the ferroelectric capacitors fc1 and fc2 are formed inside an area that is defined by the points A1, A2, A3, and A4 given as an example (see FIG. 11). This provides stability for the ferroelectric film and circuit operations, and also contributes to the size reduction of a nonvolatile SRAM cell.

Figure 18:
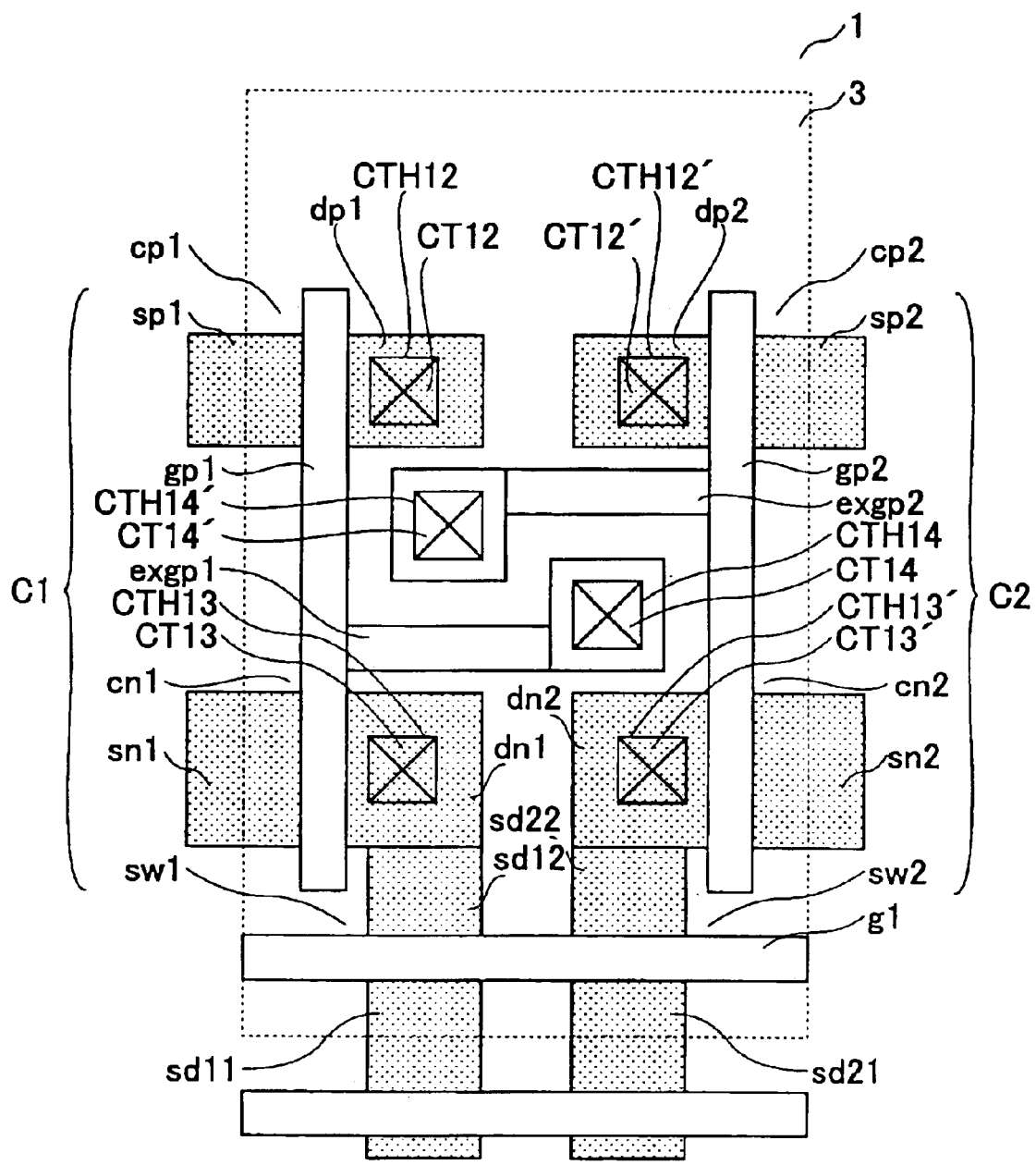
FIG. 18 is an illustrative drawing showing the first layout of a nonvolatile SRAM cell according to a third embodiment of the invention.
Figure 19:
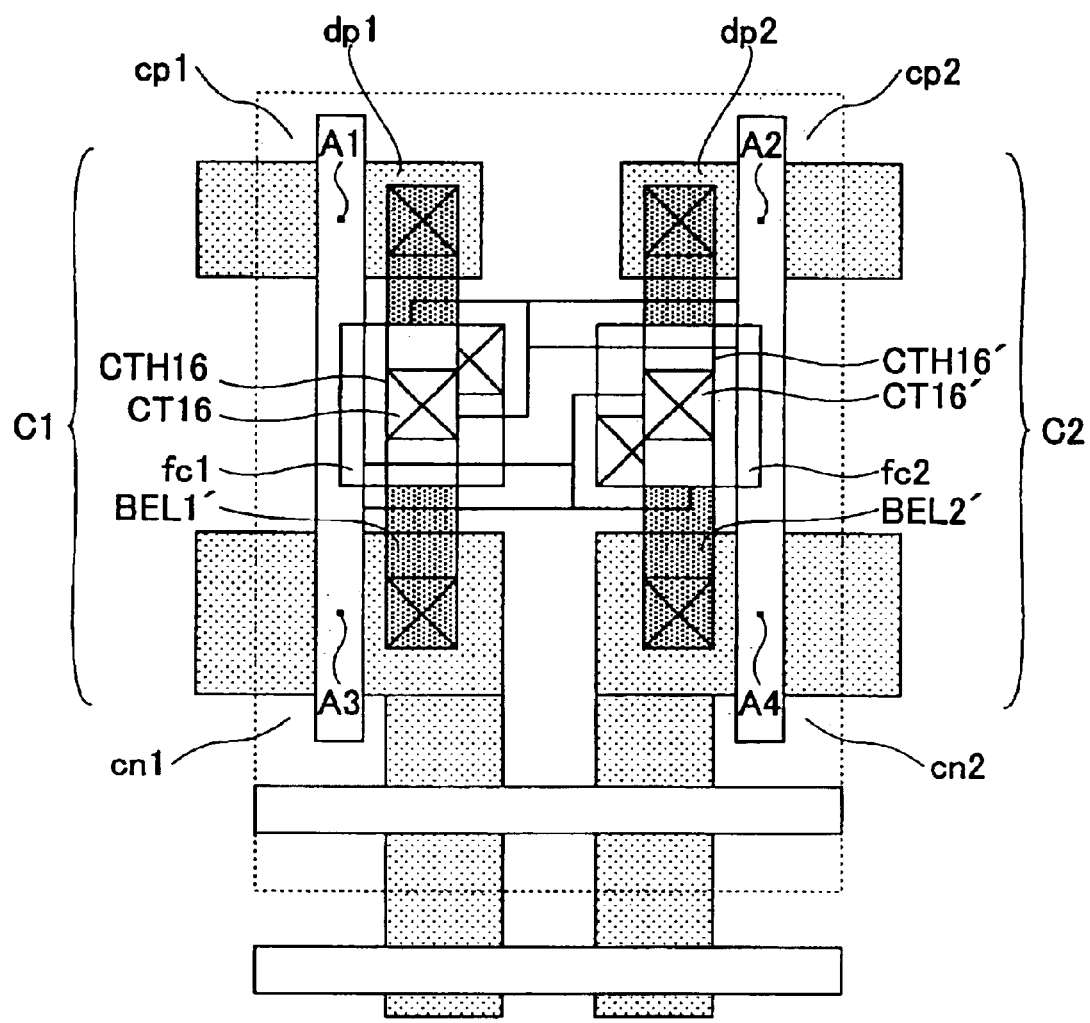
FIG. 19 is an illustrative drawing showing the second layout of the nonvolatile SRAM cell according to the third embodiment of the invention.

In the following, third through sixth embodiments relating to the present embodiment will be described. The same elements as those shown in the previous embodiments will be referred to by the same numerals, and a description thereof will be omitted. FIG. 18 and FIG. 19 are illustrative drawings showing the layout of the nonvolatile SRAM cell according to the third embodiment of the invention. FIG. 18 and FIG. 19 correspond to FIG. 9 through FIG. 11 of the second embodiment in addition to the structure shown in FIG. 9, the layout shown in FIG. 18 includes the contact plugs CT12–CT14 and CT12'–CT14' (see FIG. 10).

In the layout shown in FIG. 19, local wiring BEL1' is formed. The local wiring BEL1' is coupled to the drain diffusion region dp1 of the p-type MOS transistor cp1 and the drain diffusion region dn1 of the n-type MOS transistor cn1 of the CMOS inverter c1, and is also coupled to the region exgp2 extending from the gate electrode gp2 through the contact plug CT14' (see FIG. 18).

In this embodiment, the local wiring BEL1' also serves as the lower electrode BEL1 of the ferroelectric capacitor fc1 (see FIG. 20). With this provision, the ferroelectric capacitor fc1 is directly connected to one of the cross-coupling connections of the latch circuit (i.e., the local wiring BEL1', the contact plug CT14', and the extending region exgp2). The ferroelectric film FER1 and the upper electrode TEL1 are formed with respect to the local wiring BEL1' (BEL1). The via plug CT16 (see FIG. 12) is to be subsequently formed on the upper electrode TEL1.

Similarly, the local wiring BEL2' is coupled to the drain diffusion region dp2 of the p-type MOS transistor cp2 and the drain diffusion region dn2 of the n-type MOS transistor cn2 of the CMOS inverter c2, and is also coupled to the region exgp1 extending from the gate electrode gp1 through the contact plug CT14.

Figure 21:
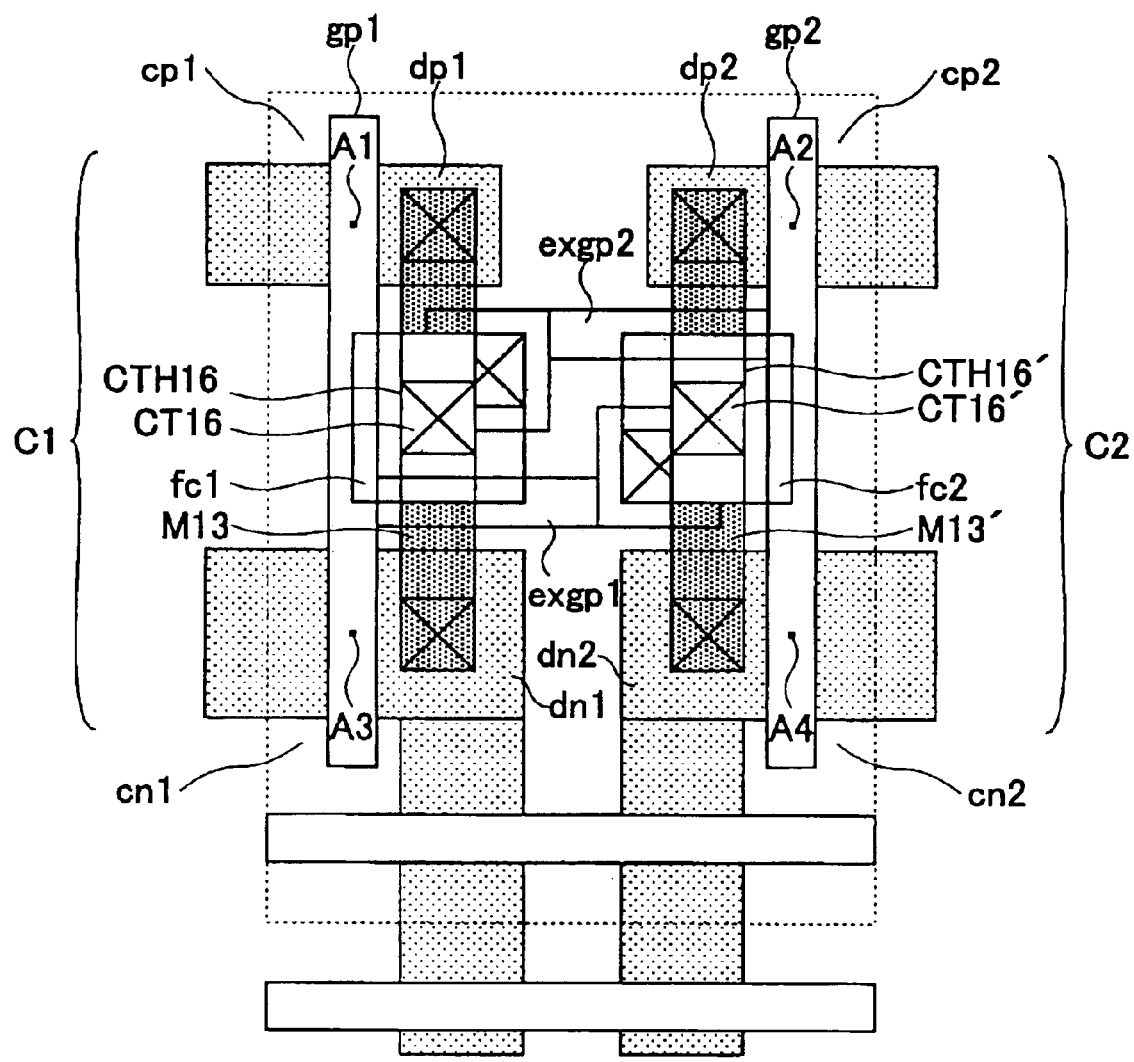
FIG. 21 is an illustrative drawing showing the layout of a nonvolatile SRAM cell according to a fourth embodiment of the invention.

Moreover, the local wiring BEL2' also serves as the lower electrode BEL2 of the ferroelectric capacitor fc2 (see FIG. 21). With this provision, the ferroelectric capacitor fc2 is directly connected to the other one of the cross-coupling connections of the latch circuit (i.e., the local wiring BEL2', the contact plug CT14, and the extending region exgp1). The ferroelectric film FER2 and the upper electrode TEL2 are formed with respect to the local wiring BEL2' (BEL2). The via plug CT16' (see FIG. 12) is subsequently formed on the upper electrode TEL2.

In this embodiment, the local wiring BEL1' and BEL2' serve as the respective lower electrodes BEL1 and BEL2 of the ferroelectric capacitors fc1 and fc2, and also serve as the cross-coupling connections of the latch circuit. If the lower electrodes BEL1 and BEL2 are made of a plurality of layers (e.g., Pt/IrO$_2$/Ir etc.), some of these layers may be selected and used for the purpose of providing the local wiring.

In what follows, the process of manufacturing the stacked-layer structure shown in FIG. 18 and FIG. 19 will be described. With reference to FIG. 18, a first inter-layer insulation film D1 (see FIG. 20) is formed first in addition to the structure shown in FIG. 9. That is, BPSG, a silicon nitride film, or a silicon dioxide film is deposited on the silicon substrate 1 shown in FIG. 9 after the process of FIG. 9 is completed. Heat treatment is then applied for the improvement of fineness, followed by a planarizing process by the CMP method.

The contact holes CTH12–CTH14 and CTH12'–CTH14' are then formed. That is, photolithography is applied for the patterning of plane shapes of these contact holes, and the first inter-layer insulation film D1 is then etched.

The contact plugs CT12–CT14 and CT12'–CT14' are then formed. Namely, barrier metal (Ti/TiN) is sputtered first in the contact holes CTH12–CTH14 and CTH12'–CTH14'. Tungsten W serving as a plug material is then deposited by the CVD method or the like, followed by a planarizing process by the CMP method.

With reference to FIG. 19, a first conductive film (not shown) is deposited as the lower electrodes BEL1 and BEL1' on the first inter-later insulation film D1 and the contact plugs CT12–CT14 and CT12'–CT14'. On the first conductive film, a PZT film (not shown) is deposited as the ferroelectric films FER1 and FER2, and is then crystallized by annealing in the oxygen-content atmosphere. Furthermore, a second conductive film (not shown) is formed as the upper electrodes TEL1 and TEL2. These processes are the same as in the first embodiment.

On the top of the second conductive film, then, a first hard mask (not shown) is formed. Using the first hard mask, photolithography is performed to provide the patterning of the plane shape of the local wiring BEL1' (inclusive of the lower electrode BEL1) and the local wiring BEL2' (inclusive of the lower electrode BEL2) (see FIG. 20). The second conductive film, the PZT film, and the first conductive film are successively etched at places where the first hard mask does not cover. The first hard mask is removed after this etching process.

Thereafter, a second hard mask (not shown) is formed on the second conductive film. Using the second hard mask, photolithography is performed to provide the patterning of the plane shape of the ferroelectric capacitors fc1 and fc2. Subsequently, the second conductive film and the PZT film are successively etched at places where the second hard mask does not cover. The second hard mask is removed after this etching process.

In this manner, the ferroelectric capacitor fc1 comprised of the local wiring BEL1' partly serving as the lower electrode BEL1, the ferroelectric film FER1, and the upper electrode TEL1 as well as the ferroelectric capacitor fc2 comprised of the local wiring BEL2' partly serving as the lower electrode BEL2, the ferroelectric film FER2, and the upper electrode TEL2 are formed (see FIG. 20). It should be noted that the process performed after the formation of the ferroelectric capacitors fc1 and fc2 is the same as the manufacturing process corresponding to FIG. 12 and subsequent drawings described in connection with the second embodiment.

Figure 20A:
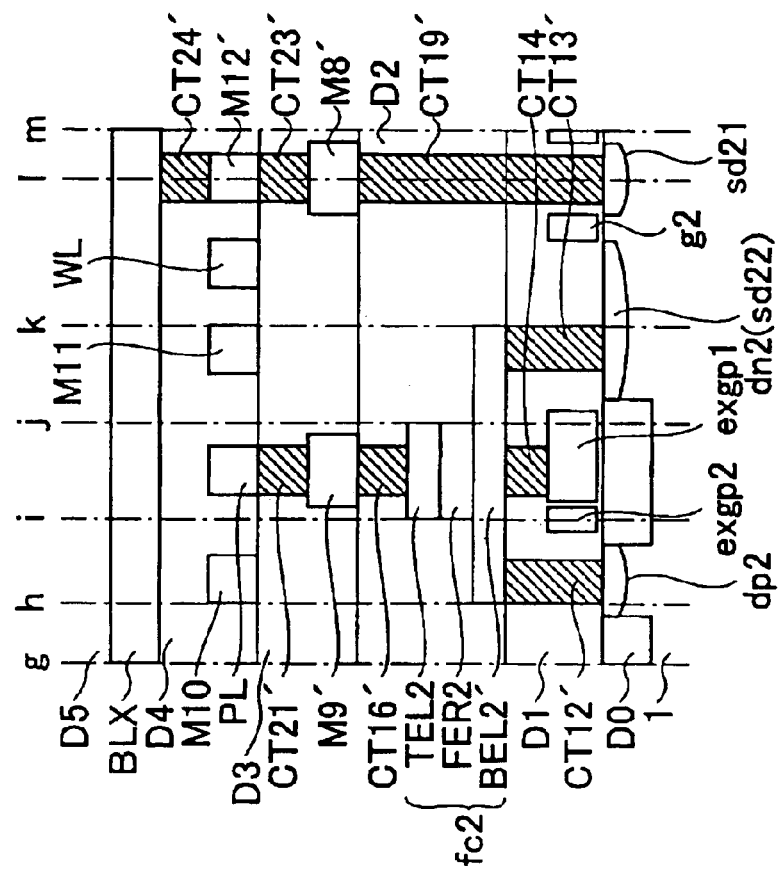
FIGS. 20A and 20B are illustrative drawings showing cross-sectional views of the nonvolatile SRAM cell according to the third embodiment.
Figure 20B:
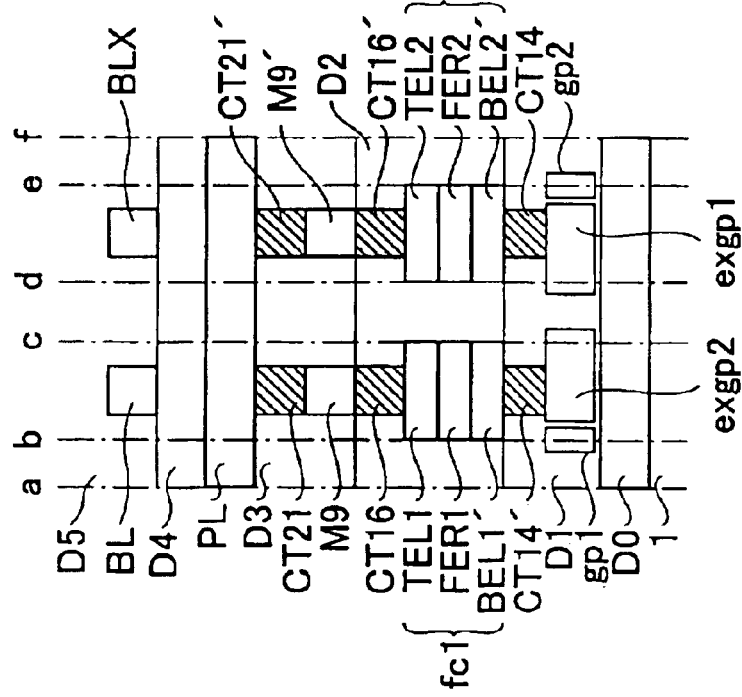

FIGS. 20A and 20B are illustrative drawings showing cross-sectional views of the nonvolatile SRAM cell according to this embodiment. FIG. 20A shows a cross-sectional view taken along the same line X–X' that is shown in FIG. 16 corresponding to the second embodiment. Grids a–f extending in the vertical direction are illustrated. FIG. 20B shows a cross-sectional view taken along the same line Y–Y' that is shown in FIG. 16. Grids g–m extending in the horizontal direction are illustrated.

In FIG. 20A, the region exgp2 extending from the gate electrode gp2 of the CMOS inverter c2 is coupled to the local wiring BEL1' through the contact plug CT14'. The ferroelectric film FER1 and the upper electrode TEL1 are formed with respect to the local wiring BEL1' (inclusive of the lower electrode BEL1).

By the same token, the region exgp1 extending from the gate electrode gp1 of the CMOS inverter c1 is coupled to the local wiring BER2' through the contact plug CT14. The ferroelectric film FER2 and the upper electrode TEL2 are formed with respect to the local wiring BER2' (inclusive of the lower electrode BEL2).

In FIG. 20B, the drain diffusion region dp2 of the p-type MOS transistor cp2 and the drain diffusion region dn2 of the n-type MOS transistor cn2 of the CMOS inverter c2 are coupled to the local wiring BEL2' through the contact plugs CT12' and CT13', respectively. The ferroelectric film FER2 and the upper electrode TEL2 are formed with respect to the lower electrode BEL2 of the ferroelectric capacitor fc2 that is part of the local wiring BEL2'.

In the cross-sectional structure shown in FIGS. 20A and 20B, the stacked-layer structure that is formed after the provision of the ferroelectric capacitors fc1 and fc2 is the same as the structure described in connection with the second embodiment (see FIG. 17), and a description thereof will be omitted.

FIG. 21 is an illustrative drawing showing the layout of a nonvolatile SRAM cell according to the fourth embodiment of the invention. FIG. 21 illustrates a process by which a layer is formed after the layout shown in FIG. 18 of the third embodiment.

In the layout shown in FIG. 21, local wiring M13 is formed. The local wiring M13 is coupled to the drain diffusion region dp1 of the p-type MOS transistor cp1 and the drain diffusion region dn1 of the n-type MOS transistor cn1 of the CMOS inverter c1, an is also coupled to the region exgp2 extending from the gate electrode gp2 through the contact plug CT14'.

By the same token, local wiring M13' is formed. The local wiring M13' is coupled to the drain diffusion region dp2 of the p-type MOS transistor cp2 and the drain diffusion region dn2 of the n-type MOS transistor cn2 of the CMOS inverter c2, an is also coupled to the region exgp1 extending from the gate electrode gp1 through the contact plug CT14.

In this embodiment, the local wiring M13 and M13' are anti-oxidizing films (e.g., iridium). Such anti-oxidizing films are provided for the purpose of preventing the oxidization of conductive materials filling the contact holes (e.g., tungsten, referred to as a tungsten plug) when annealing process is used in the formation process of the ferroelectric films FER1 and FER2 (see FIG. 22) or in a process performed prior to or after such formation process. In this embodiment, the anti-oxidizing films are effectively utilized to form part of the cross-coupling connections of the latch circuit.

The ferroelectric capacitor fc1 is formed directly on the metal wiring M13. On the metal wiring M13, the lower electrode BEL1, the ferroelectric film FER1, and the upper electrode TEL1 are stacked one over another in the order named (see FIG. 22). Furthermore, the via plug CT16 is to be subsequently formed on the upper electrode TEL1 (see FIG. 12).

Similarly, the ferroelectric capacitor fc2 is formed directly on the metal wiring M13'. On the metal wiring M13', the lower electrode BEL2, the ferroelectric film FER2, and the upper electrode TEL2 are stacked one over another in the order named. Furthermore, the via plug CT16' is to be subsequently formed on the upper electrode TEL2.

In the following, the process of manufacturing the stacked-layer structure shown in FIG. 21 will be described. As a premise, the first inter-layer insulation film D1, the contact plugs CT12–CT14 and CT12'–CT14' are in place (see FIG. 20).

With reference to FIG. 21, the local wiring M13 and M13' are formed first as anti-oxidizing films. That is, photolithography is performed first to attend to the patterning of plane shape of the local wiring M13 and M13', and wiring grooves are formed by etching in the first inter-layer insulation film D1 while including the contact plugs CT12–CT14 and CT12'–CT14'.

In the following, iridium is deposited in the wiring grooves by sputtering. With respect to iridium, photolithography is performed for the patterning of the plane shape of wiring, followed by etching. Then, an anti-oxidizing film is deposited to cover the first inter-layer insulation film D1 and the iridium wiring. A planarizing process is then carried out by the CMP method with respect to the anti-oxidizing film.

Figure 22A:
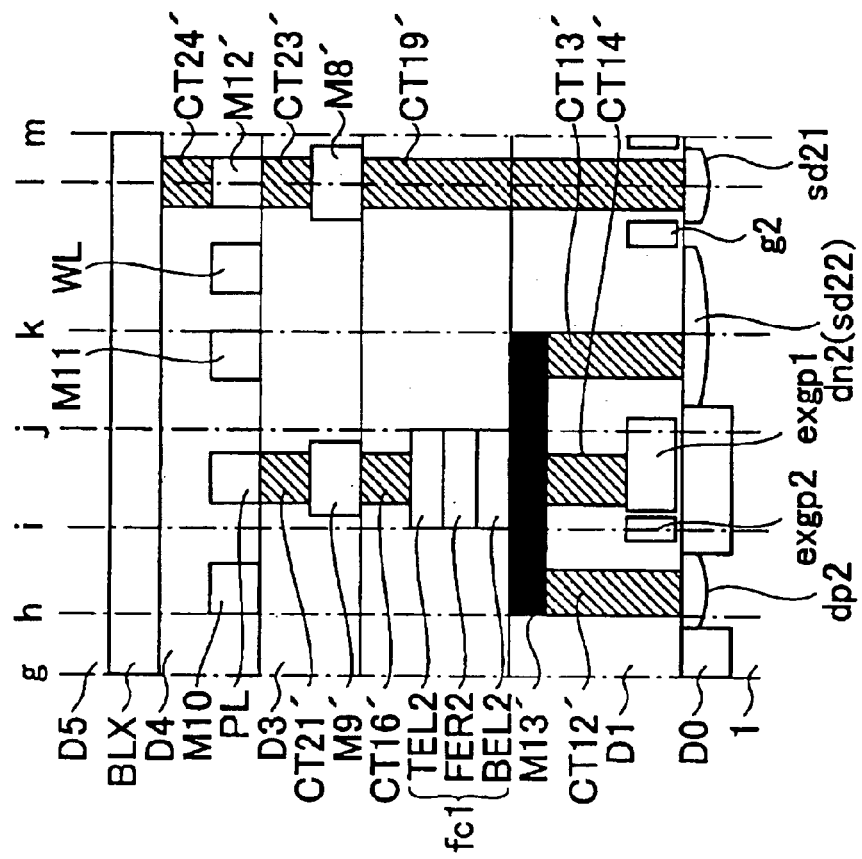
FIGS. 22A and 22B are illustrative drawings showing cross-sectional views of the nonvolatile SRAM cell according to the fourth embodiment.
Figure 22B:
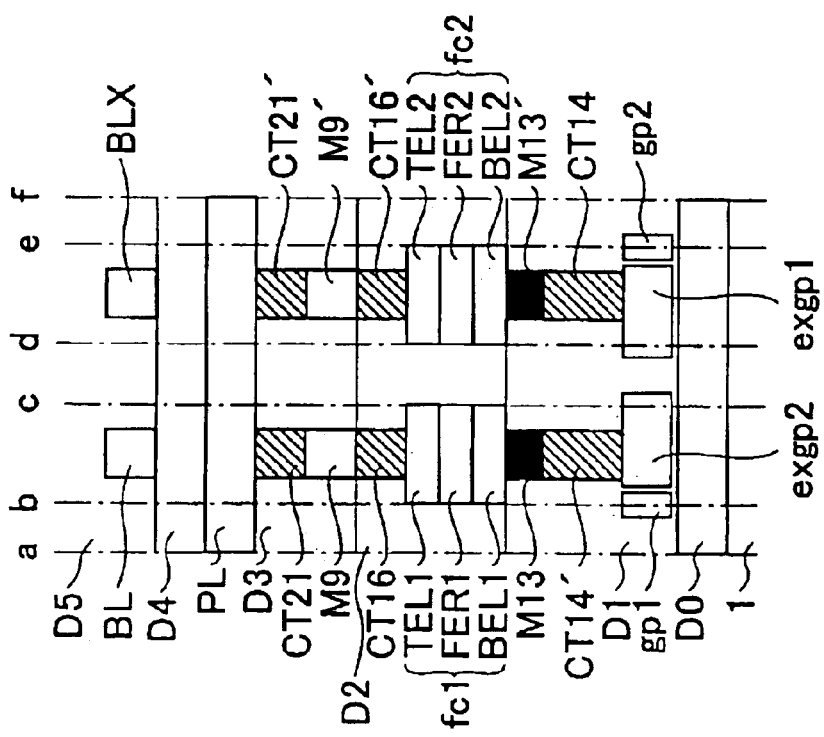

The process performed after formation of the ferroelectric capacitors fc1 and fc2 is the same as the manufacturing process corresponding to FIG. 12 and subsequent drawings described in connection with the second embodiment. FIGS. 22A and 22B are illustrative drawings showing cross-sectional views of the nonvolatile SRAM cell according to this embodiment. FIG. 22A shows a cross-sectional view taken along the same line X–X' that is shown in FIG. 16 corresponding to the second embodiment. Grids a–f extending in the vertical direction are illustrated. FIG. 22B shows a cross-sectional view, taken along the same line Y–Y' that is shown in FIG. 16. Grids g–m extending in the horizontal direction are illustrated.

In FIG. 22A, the region exgp2 extending from the gate electrode gp2 of the CMOS inverter c2 is coupled to the local wiring M13 through the contact plug CT14'. The local wiring M13 is coupled to the lower electrode BEL1 of the ferroelectric capacitor fc1, and the ferroelectric film FER1 and the upper electrode TEL1 are formed with respect to the lower electrode BEL1.

By the same token, the region exgp1 extending from the gate electrode gp1 of the CMOS inverter c1 is coupled to the local wiring M13' through the contact plug CT14. The local wiring M13' is coupled to the lower electrode BEL2 of the ferroelectric capacitor fc2, and the ferroelectric film FER2 and the upper electrode TEL2 are formed with respect to the lower electrode BEL2.

In FIG. 22B, the drain diffusion region dp2 of the p-type MOS transistor cp2 and the drain diffusion region dn2 of the n-type MOS transistor cn2 of the CMOS inverter c2 are coupled to the local wiring M13' through the contact plugs CT12' and CT13'. The local wiring M13' is directly coupled to the lower electrode BEL2 of the ferroelectric capacitor fc2, and the ferroelectric film FER2 and the upper electrode TEL2 are formed with respect to the lower electrode BEL2.

In the cross-sectional structure shown in FIGS. 22A and 22B, the stacked-layer structure that is formed after the provision of the ferroelectric capacitors fc1 and fc2 is the same as the structure described in connection with the second embodiment (see FIG. 17), and a description thereof will be omitted.

FIGS. 23A and 23B are illustrative drawings showing cross-sectional views of the nonvolatile SRAM cell according to the fifth embodiment. FIG. 22A shows a cross-sectional view taken along the same line X–X' that is shown in FIG. 16 corresponding to the second embodiment. Grids a–f extending in the vertical direction are illustrated. FIG. 22B shows a cross-sectional view taken along the same line Y–Y' that is shown in FIG. 16. Grids g–m extending in the horizontal direction are illustrated.

In the nonvolatile SRAM cell according to this embodiment, barrier metal BM is used as a material for the local wiring M13 and M13' (see FIG. 23B). This barrier metal BM is the same as the barrier metal that is deposited together with tungsten when forming the contact plugs CT12, CT12', CT13, and CT13' that are described in the fourth embodiment (see FIG. 22B).

The method of manufacturing the nonvolatile SRAM cell according to this embodiment will be described.

With reference to FIGS. 23A and 23B, the following description is based on the premise that the first inter-layer insulation film D1 is in place. The contact holes CTH12–CTH14 and CTH12'–CTH14' are formed first. That is, photolithography is applied for the patterning of plane shapes of these contact holes, and the first inter-layer insulation film D1 is then etched.

The contact plugs CT12–CT14 and CT12'–CT14' are then formed. Namely, barrier metal (Ti/TiN) is sputtered first in the contact holes CTH12–CTH14 and CTH12'–CTH14'. Tungsten W serving as a plug material is then deposited by the CVD method or the like.

With the barrier metal BM and tungsten deposited in their places, the CMP method is applied to tungsten, leaving the barrier metal uniformly. Subsequently, photolithography is applied for the patterning of plane shapes of the local wiring M13 and M13', and the barrier metal is then etched.

The process that is performed after the formation of the ferroelectric capacitors fc1 and fc2 is the same as the process of the fourth embodiment.

In FIG. 23A, the region exgp2 extending from the gate electrode gp2 of the CMOS inverter c2 is coupled to the local wiring M13 through the contact plug CT14'. The local wiring M13 is coupled to the lower electrode BEL1 of the ferroelectric capacitor fc1, and the ferroelectric film FER1 and the upper electrode TEL1 are formed with respect to the lower electrode BELL.

By the same token, the region exgp1 extending from the gate electrode gp1 of the CMOS inverter c1 is coupled to the local wiring M13' through the the contact plug CT14. The local wiring M13' is coupled to the lower electrode BEL2 of the ferroelectric capacitor fc2, and the ferroelectric film FER2 and the upper electrode TEL2 are formed with respect to the lower electrode BEL2.

In FIG. 23B, the drain diffusion region dp2 of the p-type MOS transistor cp2 and the drain diffusion region dn2 of the n-type MOS transistor cn2 of the CMOS inverter c2 are coupled to the local wiring M13' through the contact plugs CT12' and CT13'.

The barrier metal. BM that partly forms the contact plugs CT12' and CT13' also serves as the local wiring M13' as it is. The local wiring M13' is directly connected to the lower electrode BEL2 of the ferroelectric capacitor fc2, and the ferroelectric film FER2 and the upper electrode TEL2 are formed with respect to the lower electrode BEL2.

In the cross-sectional structure shown in FIGS. 23A and 23B, the stacked-layer structure that is formed after the provision of the ferroelectric capacitors fc1 and fc2 is the same as the structure described in connection with the second embodiment (see FIG. 17), and a description thereof will be omitted.

Figure 24B:
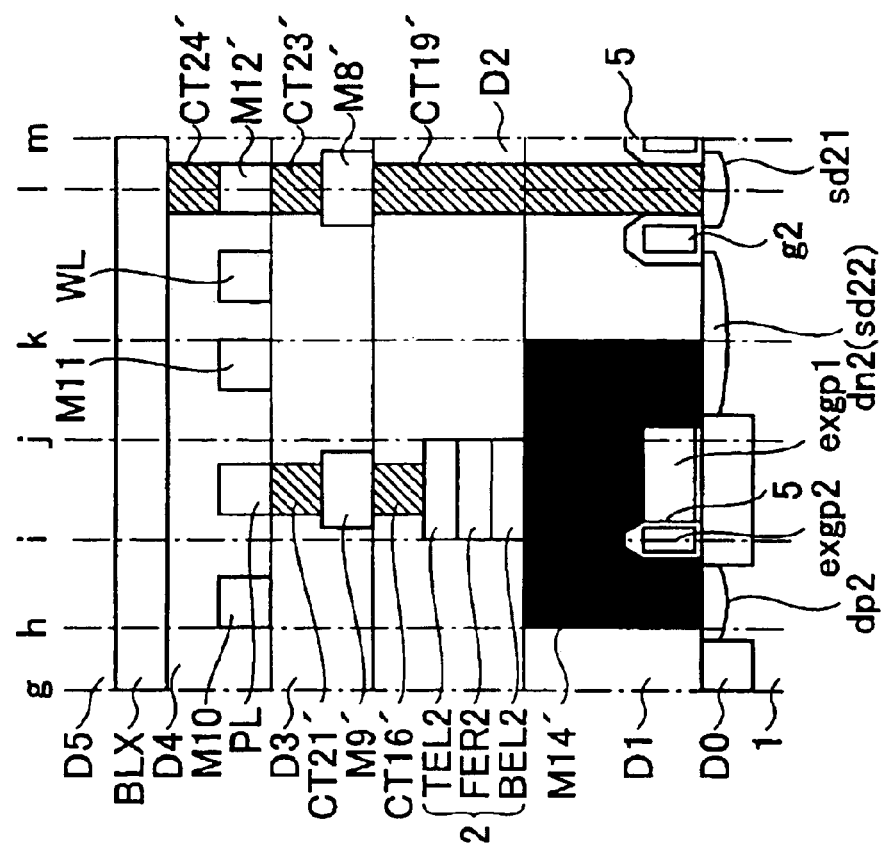
FIGS. 24A and 24B are illustrative drawings showing cross-sectional views of the nonvolatile SRAM cell according to the sixth embodiment of the invention.
Figure 24A:
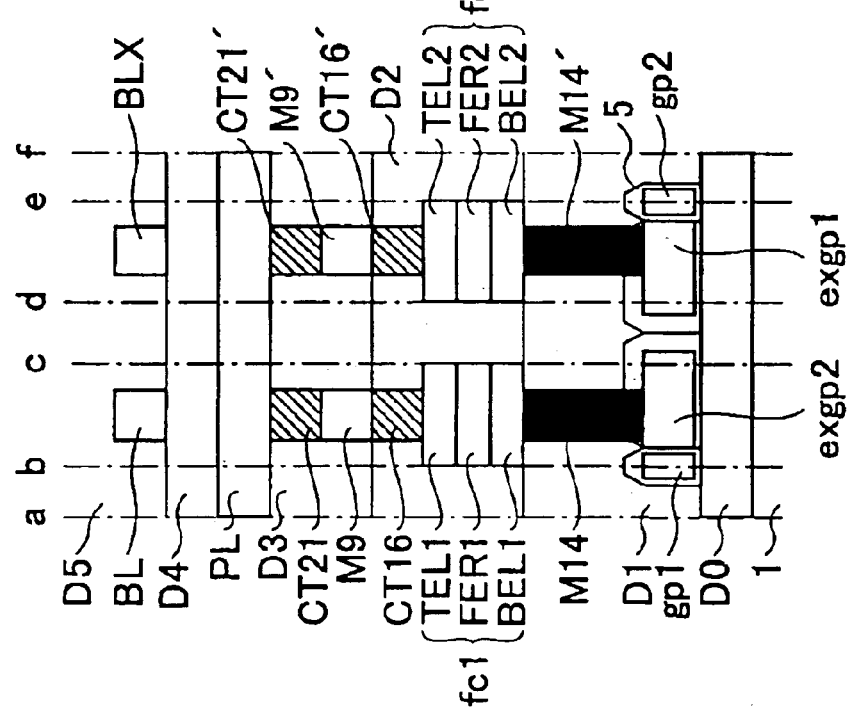

FIGS. 24A and 24B are illustrative drawings showing cross-sectional views of the nonvolatile SRAM cell according to the sixth embodiment of the invention. FIG. 24A shows a cross-sectional view taken along the same line X–X' that is shown in FIG. 16 corresponding to the second embodiment. Grids a–f extending in the vertical direction are illustrated. FIG. 24B shows a cross-sectional view taken along the same line Y–Y' that is shown in FIG. 16. Grids g–m extending in the horizontal direction are illustrated.

In the nonvolatile SRAM cell according to this embodiment, contact plugs are formed in a wiring shape so as to serve as the local wiring M15 and M15' described in the third embodiment (see FIG. 24B). The contact plugs serve both the function of the contact plugs CT12–CT14 and CT12'–CT14' and the function of the metal wiring M13 and M13' that were described in the fifth embodiment. The local wiring M14 and M14' that are formed by the contact plugs having wiring shape are made of conductive material such as tungsten.

In the following, the method of manufacturing the nonvolatile SRAM cell of this embodiment will be described.

With reference to FIG. 24, the following description is based on the premise that the structure of FIG. 9 described in the second embodiment is already in place. Spacers are formed on the sidewalls of the gate electrodes gp1 and gp2 and the regions exgp1 and exgp2 extending from the respective gate electrodes gp1 and gp2, and a $Si_3N_4$ film 5 is deposited on the entire surface (see FIG. 24A). Gaps formed in these spacers are then completely filled with an $SiO_2$ film.

Thereafter, the first inter-layer insulation film D1 is deposited. That is, BPSG, a silicon nitride film, or a silicon dioxide film is deposited on the $Si_3N_4$ film 5 and the silicon substrate 1. Heat treatment is then applied for the improvement of fineness, followed by a planarizing process by the CMP method.

The contact holes having wiring shape are then formed. This process is performed by utilizing the self-align contact (SAC) technology. An oversized mask pattern is used for the patterning of plane shape of the local wiring M14 and M14' by photolithography. Dry etching is then performed with respect to the first inter-layer insulation film D0 and the $Si_3N_4$ film 5.

As shown in FIGS. 24A and 24B, the $Si_3N_4$ films 5 that covers the region exgp2 extending from the gate electrode g2 is also partially etched at the place corresponding to the local wiring M14. By the same token, the $Si_3N_4$ films 5 that covers the region exgp1 extending from the gate electrode g1 is also partially etched at the place corresponding to the local wiring M14'.

Then, the local wiring M14 and M14' are formed. Namely, barrier metal (Ti/TiN) is sputtered first in the contact holes having wiring shape. Tungsten W serving as a conductive material is then deposited by the CVD method or the like, and a planarizing process is carried out by the CMP method.

Electric coupling is provided between the local wiring M14 and the region exgp2 at the place corresponding to the etched portion of the Si3N4 film 5. In the same manner, electric coupling is provided between the local wiring M14' and the region exgp1 at the place corresponding to the etched portion of the Si3N4 film 5. The process that is performed after the formation of the ferroelectric capacitors fc1 and fc2 is the same as the process of the fourth embodiment.

In FIG. 24A, the region exgp2 extending from the gate electrode gp2 of the CMOS inverter c2 is coupled to the local wiring M14. The local wiring M14 is coupled to the lower electrode BEL1 of the ferroelectric capacitor fc1, and the ferroelectric film FER1 and the upper electrode TEL1 are formed with respect to the lower electrode BEL1.

Similarly, the region exgp1 extending from the gate electrode gp1 of the CMOS inverter c1 is coupled to the local wiring M14'. The local wiring M14' is coupled to the lower electrode BEL2 of the ferroelectric capacitor fc2, and the ferroelectric film FER2 and the upper electrode TEL2 are formed with respect to the lower electrode BEL2.

FIG. 24B illustrates that the local wiring M14' is formed as a contact plug having the shape of wiring. The drain diffusion region dp2 of the p-type MOS transistor cp2 and the drain diffusion region dn2 of the n-type MOS transistor cn2 of the CMOS inverter c2 is directly connected through the local wiring M13'. The local wiring M14' is coupled to the lower electrode BEL2 of the ferroelectric capacitor fc2, and the ferroelectric film FER2 and the upper electrode TEL2 are formed with respect to the lower electrode BEL2.

In the cross-sectional structure shown in FIGS. 24A and 24B, the stacked-layer structure that is formed after the provision of the ferroelectric capacitors fc1 and fc2 is the same as the structure described in connection with the second embodiment (see FIG. 17), and a description thereof will be omitted.

The concept that runs through the second to sixth embodiments described above is directed to various forms of the local wiring that connects between the drain diffusion region dp1 of the p-type MOS transistor cp1 and the drain diffusion region dn1 of the n-type MOS transistor cn1 of the CMOS inverter c1 (e.g., see FIG. 9).

Through the second to sixth embodiments, the lower electrodes BEL1 and BEL2 of the respective ferroelectric capacitors fc1 and fc2 are coupled to the local wiring that connects between the impurity diffusion regions of the transistors of the latch circuit where these impurity diffusion regions (e.g., dp1, dn1, dp2, and dn2) are different from the impurity diffusion regions (e.g., sp1, sn1, sp2, and sn2) coupled to the power supply voltage VDD or the ground voltage VSS. In this case, the local wiring is made of a material having a higher melting point than the metal of the metal wiring.

To be specific, the lower electrodes BEL1 and BEL2 of the respective ferroelectric capacitors fc1 and fc2 are coupled to the local wiring that connects between the drain diffusion regions (dp1 and dn1, dp2 and dn2) included in the two respective inverters c1 and c2.

In contrast with the wiring M1 and M1' of the first embodiment (see FIG. 5), the local wiring is provided in a layer situated below the layer in which the ferroelectric capacitors fc1 and fc2 are provided. The cross-coupling connections of the CMOS inverters c1 and c2 are situated substantially straight below the respective ferroelectric capacitors fc1 and fc2.

In what follows, a description will be given of variations of the invention with respect to the first embodiment through the sixth embodiment.

In the embodiments described above, the latch circuit is comprised of the CMOS inverters c1 and c2 that are cross-coupled. The invention is not limited to this construction, and is applicable to any latch circuit that is comprised of a plurality of transistors.

In the embodiments described above, the ferroelectric capacitor fc1 is formed to correspond to the CMOS inverter c1, and the ferroelectric capacitor fc2 is formed to correspond to the CMOS inverter c2. That is, the two ferroelectric capacitors fc1 and fc2 are provided with respect to a single nonvolatile SRAM cell 3. The invention is not limited to this configuration, and is applicable to a configuration in which two or more ferroelectric capacitors are provided for a single CMOS inverter.

In the first through sixth embodiments described above, the structure according to the invention is applied to SRAM cells. The structure according to the invention is not limited to application to SRAM cells, and is applicable to a latch circuit or a flip-flop circuit, for example.

In this case, provision is made to form a ferroelectric capacitor at a node at which two inverter circuits are cross-coupled.

Further, the present invention is not limited to these embodiments, but various variations and modifications may be made without departing from the scope of the present invention.

The present application is based on Japanese priority application No. 2002-371135 filed on Dec. 20, 2002, with the Japanese Patent Office, the entire contents of which are hereby incorporated by reference.

What is claimed is:

1. A nonvolatile semiconductor memory device, comprising:
   a substrate;
   a plurality of transistors formed on said substrate to constitute a latch;
   a plate line; and
   a pair of capacitors each including a lower electrode, a ferroelectric film, and an upper electrode, said pair of capacitors being provided in a layer situated above said substrate and below a metal wiring layer in which said plate line is formed, wherein said pair of capacitors is provided in a layer situated below a metal wiring layer in which a bit line is formed.

2. A nonvolatile semiconductor memory device, comprising:
   a substrate;
   two inverters formed on said substrate and cross-coupled, each inverter including a drain diffusion region;
   a plate line; and
   a pair of capacitors each including a lower electrode coupled to the drain diffusion region of a corresponding one of said two inverters, a ferroelectric film, and an upper electrode coupled to said plate line, said pair of capacitors being provided in a layer situated above said substrate and below a metal wiring layer in which said plate line is formed, wherein said pair of capacitors is provided in a layer situated below a metal wiring layer in which a bit line is formed.

3. A nonvolatile semiconductor memory device, comprising:
   a substrate;
   a plurality of transistors formed on said substrate to constitute a latch, each of said transistors including a first impurity diffusion region for coupling to a power supply voltage and a second impurity diffusion region having an extending region;
   a plate line; and
   a pair of capacitors provided in a layer situated above said substrate and below a metal wiring layer in which said plate line is formed, each of said capacitors including a lower electrode, a ferroelectric film, and an upper electrode coupled to said plate line, wherein the lower electrode is coupled to the extending region, wherein said pair of capacitors is provided in a layer situated below a metal wiring layer in which a bit line is formed.

4. The nonvolatile semiconductor memory device as claimed in claim 3, wherein said transistors constitute two inverters, each of which includes a drain diffusion region that is the second impurity diffusion region having the extending region, and the lower electrodes of the two capacitors are coupled to the extending regions of the drain diffusion regions of the two inverters, respectively.

5. The nonvolatile semiconductor memory device as claimed in claim 4, wherein said pair of capacitors is provided outside a plane area defined by said two inverters.

6. The nonvolatile semiconductor memory device as claimed in claim 4, wherein each of said two inverters includes a p-type transistor which includes the drain diffusion region having the extending region, said extending region extending in a direction substantially perpendicular to a direction in which said drain diffusion region is formed.

7. The nonvolatile semiconductor memory device as claimed in claim 4, wherein with respect to each of said two inverters, a drain diffusion region of a p-type transistor is coupled to a drain diffusion region of an n-type transistor through wiring that is provided in a layer situated above layers in which said pair of capacitors is formed.

8. The nonvolatile semiconductor memory device as claimed in claim 7, wherein each of said two inverters includes a gate electrode and an extending region extending from said gate electrode in a direction substantially perpendicular to a direction in which said gate electrode is formed, thereby coming in contact with said wiring.

9. A nonvolatile semiconductor memory device, comprising:
   a substrate;
   a plurality of transistors formed on said substrate to constitute a latch, each of said transistors including a first impurity diffusion region for coupling to a power supply voltage and a second impurity diffusion region different from the first impurity diffusion region;
   local wiring connecting between the second impurity diffusion region of one of said transistors to the second impurity diffusion region of another one of said transistors;
   a plate line; and
   a pair of capacitors provided in a layer situated above said substrate and below a metal wiring layer in which said plate line is formed, each of said capacitors including a lower electrode, a ferroelectric film, and an upper electrode coupled to said plate line,
   wherein the lower electrode is coupled to said local wiring, and said local wiring is made of a material having a higher melting point than a metal that forms said plate line.

10. The nonvolatile semiconductor memory device as claimed in claim 9, wherein said pair of capacitors is provided in a layer situated below a metal wiring layer in which a bit line is formed.

11. The nonvolatile semiconductor memory device as claimed in claim 9, wherein said transistors constitute two inverters, each of which includes a first drain diffusion region and a second drain diffusion region that are connected together by said local wiring, and the lower electrodes of the two capacitors are coupled to the local wirings corresponding to the two inverters, respectively.

12. The nonvolatile semiconductor memory device as claimed in claim 11, wherein said pair of capacitors is provided inside a plane area defined by said two inverters.

13. The nonvolatile semiconductor memory device as claimed in claim 9, wherein said local wiring is made of a material that forms said lower electrode.

14. The nonvolatile semiconductor memory device as claimed in claim 9, wherein said local wiring is made of an anti-oxidizing film.

15. The nonvolatile semiconductor memory device as claimed in claim 9, wherein said local wiring is made of a barrier metal material.

16. The nonvolatile semiconductor memory device as claimed in claim 9, wherein said local wiring is made of a conductive plug material.

17. The nonvolatile semiconductor memory device as claimed in claim 9, wherein the first drain diffusion region and the second drain diffusion region are a drain diffusion region of a p-type transistor and a drain diffusion region of an n-type transistor, respectively, said local wiring being provided in a layer situated below layers in which said pair of capacitors is formed.

18. The nonvolatile semiconductor memory device as claimed in claim 11, wherein each of said two inverters includes:
   a gate electrode; and
   an extending region extending from said gate electrode in a direction substantially perpendicular to a direction in which said gate electrode is formed, thereby coming in contact with said local wiring formed in a layer situated below layers in which said pair of capacitors is formed.

19. A method of forming a nonvolatile semiconductor memory device, comprising the steps of:
   forming a plurality of transistors in a substrate for making a latch circuit;
   forming a pair of capacitors in layers situated above said substrate, each of which includes a lower electrode, a ferroelectric film, and an upper electrode;
   forming metal wiring inclusive of a plate line in a layer above the layers in which said pair of capacitors is formed; and
   forming metal wiring inclusive of a bit line in a layer above the layers in which said pair of capacitors is formed.

20. The method as claimed in claim 19, wherein said ferroelectric film is formed at a film growth temperature of substantially 600 degrees Celsius or more.

* * * * *